United States Patent [19]
Knudsen

[11] Patent Number: 6,049,298
[45] Date of Patent: *Apr. 11, 2000

[54] SYSTEM AND METHOD FOR GENERATING A LINEARITY ERROR CORRECTION DEVICE FOR AN ANALOG TO DIGITAL CONVERTER

[75] Inventor: Niels Knudsen, Austin, Tex.

[73] Assignee: National Instruments Corp., Austin, Tex.

[ * ] Notice: This patent is subject to a terminal disclaimer.

[21] Appl. No.: 09/200,543

[22] Filed: Nov. 25, 1998

Related U.S. Application Data

[63] Continuation-in-part of application No. 09/105,283, Jun. 26, 1998, which is a continuation-in-part of application No. 08/772,785, Dec. 23, 1996, Pat. No. 5,781,138, and a continuation-in-part of application No. 09/105,847, Jun. 26, 1998, which is a continuation-in-part of application No. 08/771,480, Dec. 23, 1996, Pat. No. 5,781,134, and a continuation-in-part of application No. 09/186,314, Nov. 4, 1998.

[51] Int. Cl.[7] .................................................. H03M 1/06
[52] U.S. Cl. ........................................... 341/118; 341/143
[58] Field of Search ....................................... 341/118, 143, 341/120, 155; 375/27

[56] References Cited

U.S. PATENT DOCUMENTS

| | | |
|---|---|---|
| 5,101,205 | 3/1992 | Yasuda . |
| 5,781,137 | 7/1998 | Knudsen . |
| 5,781,138 | 7/1998 | Knudsen . |

OTHER PUBLICATIONS

Candy, James C. and Temes, Gabor C., *Oversampling Delta–Sigma Data Converters*, 1992, pp. 227–228.
Candy, James C. and Temes, Gabor C., *Oversampling Delta–Sigma Data Converters*, 1992, pp. 192–195.

*Primary Examiner*—Brian Young
*Attorney, Agent, or Firm*—Conley, Rose & Tayon; Jeffrey C. Hood

[57] ABSTRACT

A system and method for reducing linearity errors in an A/D converter, such as a delta-sigma converter. The linearity errors in the delta-sigma converter are modeled by generating a set of digital signals representative of an inputted sine wave. The set of digital signals are low-pass filtered and subjected to a fast Fourier transform algorithm to generate a frequency domain representation of the sine wave. Thereafter, a net linearity error spectrum is removed from the frequency domain representation and inverse Fourier transform back into the time domain. The filtered set of digital signals are also sorted into subsets of digital signals where each signal in a subset corresponds to a particular output of a delta-sigma modulator contained within the delta-sigma converter. A fast Fourier transform algorithm is applied to each of the filtered subsets of digital signals to generate a frequency domain representation thereof. Specific linearity errors are generated by applying an inverse Fourier transform algorithm to each of the specific linearity error spectrums in the frequency domain representations of the filtered subsets of digital signals. Thereafter, linearity error correction coefficients are generated as a function of the net linearity error and the specific linearity errors. The linearity error correction coefficients are used to generate entries in a look-up table where the entries are adjustable by digital outputs of the delta-sigma modulator. The look-up table is used to correct digital signals outputted by the delta-sigma modulator prior to decimation and digital filter.

90 Claims, 23 Drawing Sheets

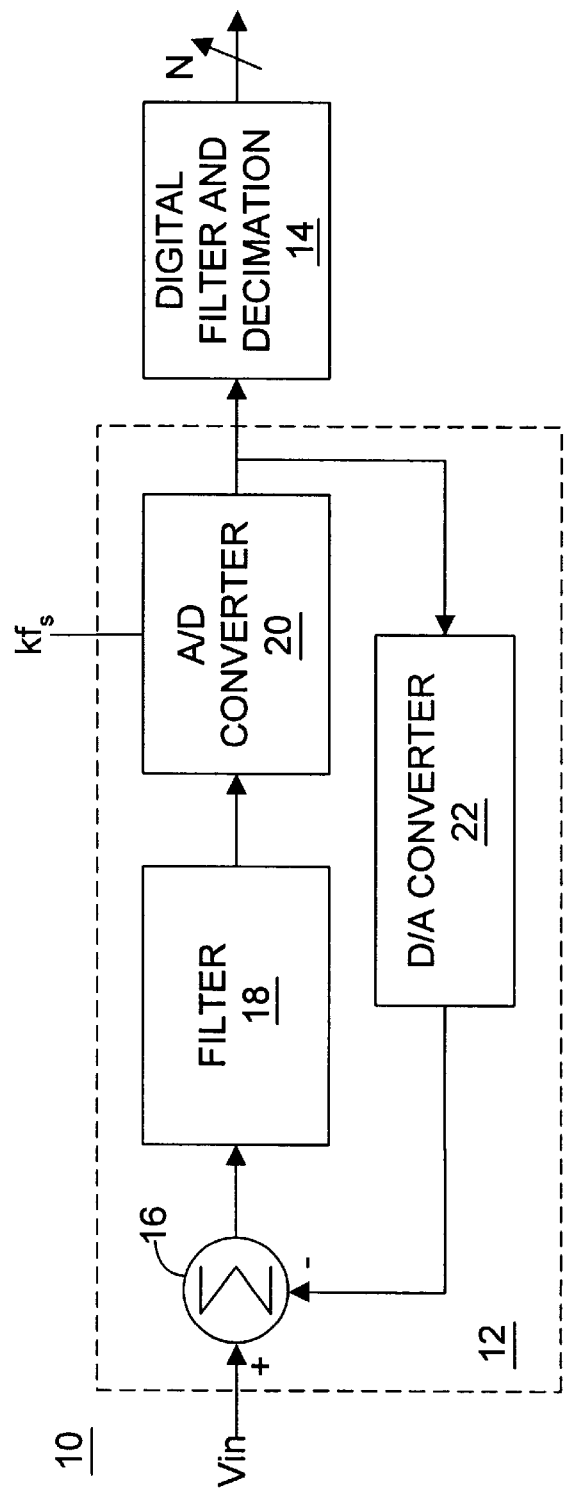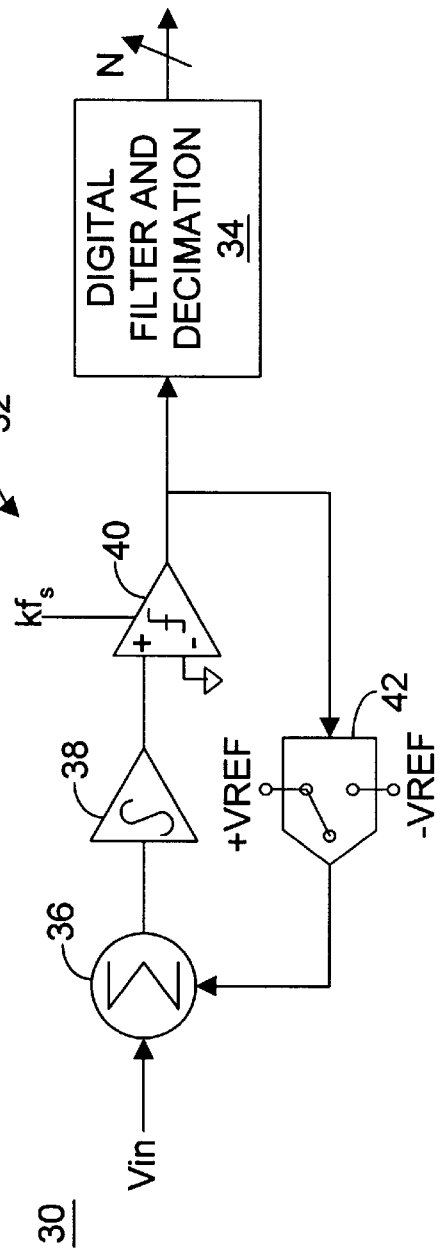
FIG. 1
FIG. 2A

SYSTEM AND METHOD FOR GENERATING A LINEARITY ERROR CORRECTION DEVICE FOR AN ANALOG TO DIGITAL CONVERTER

CONTINUATION DATA

This is a continuation-in-part of application Ser. No. 09/105,283 titled "System and Method for Generating a Sigma-Delta Correction Circuit" and filed Jun. 26, 1998 (Atty. Docket No. 5150-16501), whose inventor was Niels Knudsen, which is a continuation-in-part of application Ser. No. 08/772,785 titled "System and Method for Generating a Sigma-Delta Correction Circuit" and filed Dec. 23, 1996 (Atty. Docket No. 5150-16500), which issued as U.S. Pat. No. 5,781,138, and whose inventor was Niels Knudsen.

This is also a continuation-in-part of application Ser. No. 09/105,847 titled "System and Method for Reducing Errors in a Delta Sigma Converter" and filed Jun. 6, 1998 (Atty. Docket No. 5150-15201), whose inventor was Niels Knudsen, which is a continuation-in-part of application Ser. No. 08/771,480 titled "System and Method for Reducing Errors in a Delta Sigma Converter" and filed Dec. 23, 1996 (Atty. Docket No. 5150-15200), which issued as U.S. Pat. No. 5,781,137, and whose inventor was Niels Knudsen.

This is also a continuation-in-part of application Ser. No. 09/186,314 titled "System and Method for Generating a Sigma-Delta Correction Circuit Using Matrix Calculation of Linearity Error Correction Coefficients" and filed on Nov. 4, 1998, whose inventors were Niels Knudsen and Mark Whittington.

FIELD OF THE INVENTION

This invention relates to the art of analog-to-digital (A/D) converters, and more particularly, to A/D converters which include linearity errors.

DESCRIPTION OF THE RELATED ART

Analog-to-digital converters (ADCs) are circuits used to convert signals from the analog domain, where the signals are represented by continuous quantities such as voltage and current, to the digital domain, where the signals are represented by numbers. These circuits can be implemented in a large number of ways. Established A/D conversion techniques include flash, delta-sigma (or sigma-delta), sub-ranging, successive approximation, and integrating.

One example of an A/D converter is an over-sampled A/D converter. Oversampled A/D converters, often denoted as "delta-sigma converters" or "sigma-delta converters" are well known in the art. Delta-sigma (D/S) converters have gained in popularity due primarily to their ability to realize high resolution analog-to-digital conversion in mixed signal VLSI processors. Until recently, however, the process technology needed to make these devices commercially viable has not been available. Now that smaller integrated circuit geometries are manufacturable, D/S converters will become even more prolific in certain types of the applications, especially mixed signal integrated circuits which combine the analog-to-digital (A/D) conversion, digital-to-analog (D/A) conversion, and digital signal processing (DSP) functions on a single chip.

The D/S converter is inherently an oversampling converter, although oversampling is just one of the techniques contributing to its overall performance. A D/S converter essentially digitizes an analog signal at a very high sampling rate (oversampling) in order to perform a noise shaping function. Digital filtering after the noise shaping allows the D/S converter to achieve a high resolution when compared with conventional A/D converters. Decimation is thereafter used to reduce the effective sampling rate back to the "Nyquist" rate. To gain an understanding of D/S converters, it is important to understand the operation of oversampling, noise shaping, digital filtering and decimation, the key concepts involved.

FIG. 1 shows, in block diagram form, a single bit D/S converter 10 commonly known in the art. The single bit D/S converter 10 includes a single bit D/S modulator 12 connected to a digital filter and decimation circuit 14. The D/S modulator 12 includes a summing node 16, a filter 18, a single bit A/D converter 20, and a single bit D/A converter 22. The D/A converter 22 is connected to the output of the A/D converter 20 and operates to provide feedback to the summing node 16. The summing node 16 includes a pair of inputs, one being connected to the output of the D/A converter 22 and the other being connected to analog input signal $V_{in}$.

In operation, the output of summing node 16 is low-pass filtered by filter 18 and subsequently converted into a single bit, digital signal by A/D converter 20. The single bit digital signal in turn is converted back into an analog signal by D/A converter 22 and subtracted from analog input signal $V_{in}$ at summing node 16.

The single bit D/S modulator 12 converts the input signal $V_{in}$ into a continuous serial stream of 1s and 0s at a rate determined by sampling clock frequency, $kf_s$. Due to the feedback provided by the D/A converter 22 the average value outputted by the D/A converter 22 approaches that of the input signal $V_{in}$ if the loop has enough gain.

FIG. 2A shows a schematic implementation of the single bit D/S converter of FIG. 1. In particular, FIG. 2A shows a single bit D/S converter 30 which includes a single bit D/S modulator 32 connected to a digital filter and decimation circuit 34. The single bit D/S modulator 32 includes a summing node 36, an integrator 38, a latched comparator 40 which functions as the single bit A/D converter, and a simple switching mode device 42 which functions as the single bit D/A converter.

Integrator 38 acts as a filter and has an amplitude response in the frequency domain proportional to 1/f, where f is the input frequency. Since the chopper like action of the clocked, latched comparator 40 converts the input signal to a high frequency AC signal, varying about the average value of the input $V_{in}$, the effective quantization noise at low frequencies is greatly reduced. In effect, low frequency quantization noise is "shaped" into higher frequencies. FIG. 2B shows the simulated noise density as a function of frequency of a D/S modulator. The y-axis is in dB and the x axis is in MHz. As can be seen, the lower noise frequencies are attenuated. The exact frequency spectrum of the resulting noise shaping depends on the sampling rate, the integrator time constant, and the order of the filter.

Clearly, a single bit, digital representation of an analog signal has very little resolution. The D/S modulator 32 of FIG. 2A is very difficult to analyze in the time domain because of the apparent randomness of the single bit nature of the data. For any given input value in a single sampling interval, data from the latched comparator 40 is virtually meaningless. Only when a large number of samples are averaged, will a meaningful value result. If the input signal $V_{in}$ is near positive full scale, it is clear that there will be more 1s than 0s in the bit stream. Likewise, for signals near the negative full scale, there will be more 0s than is in the bit stream. For input signals near the midscale, there will be approximately an equal number of 1s and 0s.

After the quantization noise has been shaped by the D/S modulator 32, the output of the D/S converter 30 is further processed by the digital filter and decimator circuit 34. The purpose of the digital filter is two fold. First, the digital filter acts as an anti-aliasing filter with respect to the final sampling rate, $f_s$. Second, the digital filter filters out the higher frequency noise produced by the noise shaping process of the D/S modulator 32. Final data reduction is performed by digitally resampling the filtered output using a process called decimation. Decimation is the process of resampling at a lower rate. Decimation can be viewed as the method by which redundant signal information introduced by the oversampling process is removed.

FIG. 3 shows a multi-bit D/S converter 50 in block diagram form. The multi-bit D/S converter 50 includes a multi-bit D/S modulator 52 connected to a multi-bit digital filter and decimation circuit 54. The multi-bit D/S modulator 52 further includes a summing node 56, a filter 58, a multi-bit A/D converter 60, and a multi-bit internal D/A converter 62.

The multi-bit D/S modulator 50 of FIG. 3 operates similarly to the single-bit D/S converter of FIG. 1. The output of the summing node 56 is low-pass filtered by filter 58 and converted into a multi-bit digital signal by multi-bit internal A/D converter 60 operating at oversampling rate $kf_s$. The multi-bit D/A converter 62 is connected via a feedback loop between the output of the multi-bit A/D converter 60 and an input node of the summing node 56, whereby the analog signal output of the D/A converter 62 is subtracted from the analog signal input $V_{in}$. Again, the output of D/A converter 62 approaches that of the analog input signal $V_{in}$ due to the feedback involved. Digital filter and decimation circuit 54 removes quantization noise shaped into the higher frequencies and resamples the oversampled digital signal at rate $f_s$.

The multi-bit D/S converter 50 of FIG. 3 provides benefits over the single bit D/S converter 10 of FIG. 1. Namely, the multi-bit D/S converter 50 provides more resolution and less quantization noise. Additionally, the multi-bit D/S converter 50 is more stable than single bit D/S converters. However, the multi-bit D/S converter suffers from linearity errors introduced by the internal multi-bit D/A converter 62. Single bit D/S converters on the other hand do not produce linearity errors.

Linearity error is the inability of the multi-bit D/A converter to accurately translate a digital input value into an analog current or voltage. In other words, given a particular digital input, the resulting analog output of the multi-bit internal D/A converter 62 approximates the digital value but is not exactly equal to the digital value. In reality, the actual analog output differs from the digital input value by an amount equal to the linearity error.

FIG. 4 shows a graphical comparison of an ideal linear vs. non-ideal, non-linear multi-bit D/A converter. The horizontal axis represents the codes or multi-bit digital signals applied to the inputs of both types of multi-bit D/A converters, ideal and non-ideal. The vertical axis represents the analog signal output therefrom. Line L represents the transfer function of the ideal or linear D/A converter. Line NL represents the transfer function of the non-ideal or non-linear D/A converter. Variations between the two lines represent the linearity errors. The distance between points on a vertical line through both line L and the line NL represent the linearity error produced by the non-ideal D/A converter for a particular input code. For example, if digital code x is input to both the ideal D/A converter and the non-ideal D/A converter, the respective outputs would be $Y_L$ and $Y_{NL}$. The difference in voltage $\Delta Y$ represents the linearity error corresponding to digital code x. This linearity error is viewed as noise and degrades the ultimate signal to noise ratio of the D/S converter which contains the non-linear D/A converter. This linearity error is static in nature and independent of frequency and voltage.

The source of linearity errors can be traced to the internal current generators of the multi-bit D/A converter. FIG. 5 shows, in schematic form, a simplified D/A converter 70 employing a number of internal current generators 72. Each of the internal current generators 72 is selectively connected to an output node 74 via switches 76. Each switch 76 contains an input configured to receive one bit of the digital code inputted to the D/A converter 70. For example, switch $S_{N-1}$ is controlled by the most significant bit of the inputted digital code. When the most significant bit is 1, the associated current generator is connected to summing node 74. Thus, given a particular digital input code, the output of one or more of the current generators 72 is connected to the summing node 74.

If the D/A converter 70 was ideal and contained ideal current generators, current would be generated therefrom in integer units. For example, if the D/A converter 70 of FIG. 5 was an ideal 3 bit D/A converter, and a digital code inputted thereto equaled 111, the three ideal internal current generators 72 would generate 4, 2, and 1 units of current, respectively. However, internal current generators are rarely ideal. Given an input code 111, the non-ideal set of current generators, for example, might generate 4.05, 1.98, and 1.01 units of current, respectively.

The linearity error produced by the internal current generators can be further traced to a variety of causes, chief of which is the inability of integrated circuit manufacturers to form, in silicon, current generators having identical geometries. Several other causes can be related to the linearity error. Over time and use, the internal current generators may wear differently. Moreover, temperature variations may occur between the internal current generators. In any event, the physical differences between internal current generators in a D/A converter, even though slight, can produce significant errors in the translation of a digital input code into an analog equivalent.

Single bit D/A converters do not employ multiple current generators. As such, single bit D/A converters do not exhibit the non-linearity characteristics of multi-bit D/A converters. Accordingly, single bit D/S converters employing a single bit internal D/A converter, such as shown in FIG. 1, do not suffer from linearity errors. To this end, single bit D/S converters are advantageous over multi-bit D/S converters. Thus, while it is known that the resolution and stability of a multi-bit D/S converter is superior to that of a single bit D/S converter, single bit D/S converters are superior to multi-bit D/S converters to the extent that a single bit D/S converter produces less linearity error when compared to the linearity error produced by the multi-bit D/S converter. If it were not for the linearity errors caused by the internal multi-bit D/A converter, designers would generally prefer to use multi-bit D/S converters over single bit D/S converters.

It is desirable to have a multi-bit D/S converter in which the non-linearity produced by the internal D/A converter is removed or otherwise reduced. The present invention solves this problem and others by providing a multi-bit D/S converter which eliminates or otherwise reduces linearity errors.

SUMMARY OF THE INVENTION

The present invention comprises a system and method for deriving linearity error correction coefficients and constructing or configuring therefrom a linearity error correction circuit useful in enhancing resolution of an analog to digital (A/D) converter. The present invention is preferably comprised in a computer-based data acquisition (DAQ) system, the system comprising a computer system and a DAQ device comprised in or coupled to the computer system. The DAQ device includes the A/D converter according to the present invention. The present invention may be used with any of various types of A/D converters, including integrating A/D converters, flash A/D converters, sigma-delta A/D converters, sub-ranging A/D converters, and successive approximation A/D converters, among others. The A/D converter includes, for example, one or more internal digital to analog (D/A) converters which generate linearity errors.

The technique includes applying a known analog waveform, preferably a pure sine wave, to an input of the A/D converter, or to a portion of the A/D converter, and generating digital signals representative of the pure sine wave. A number of the digital signals output from the converter are recorded. These recorded digital signals contain hidden information regarding the linearity errors associated with the A/D converter. The linearity error information can be extracted and used in deriving the correction coefficients and constructing the linearity error correction circuit. In the preferred embodiment, the host computer system preferably includes software which receives the recorded signals and operates to extract the linearity error information and derive the correction coefficients. Alternatively, this operation can be performed by logic comprised on the A/D device or DAQ device.

In the preferred embodiment, a net linearity error E is extracted from the recorded samples. This is accomplished by preferably first decimating to the recorded digital signals representing the sine wave, which operates to prevent unwanted spectral leakage from high frequencies into low frequencies. Alternatively, a Hanning window may be applied to the recorded digital signals. The method then preferably transforms the resulting digital signals into the frequency domain using a frequency domain transform algorithm such as a Fast Fourier Transform (FFT) algorithm. The resulting spectrum ideally should be zero at low frequencies, except for components at certain frequencies including those at D.C. and near the frequency of the input sine wave. However, because the A/D converter is non-ideal, other frequency components of the spectrum are non-zero. These unexpected, non-zero components are caused by non-linearities inherent in the A/D converter in general and internal generators in the internal D/A converter in particular.

A net linearity error spectral content or spectrum, which represents an accumulation of specific non-linearities of the delta-sigma modulator in the frequency domain, is extracted by removing those frequency components which are expected to be non-zero, i.e.: (1) the D.C. component; (2) the components associated with a range of frequencies near the frequency of the input sine wave, the extent of the range being dependent on purity of the inputted sine wave; (3) the components at higher frequencies containing quantization noise; and (4) components at bins mirrored around the half sampling rate. Thereafter, an inverse frequency domain transform algorithm is applied to the remaining spectrum, resulting in a net linearity error in the time domain and designated as E. The net linearity error E is a column vector with each element representing an accumulation of individual linearity errors inherent in each individual generator in the D/A converter. The net linearity error is one portion of the hidden information used in the preferred embodiment to derive the correction coefficients.

Linearity errors associated with the individual generators are also determined in the preferred embodiment to derive the correction coefficients. These linearity errors are preferably isolated by first sorting or decoding the recorded digital signals into subsets.

Each value in a subset corresponds to an active state of one of the generators internal to the D/A modulator. Thus the recorded digital signals are analyzed, and for each digital sample in the recorded digital signal, the method determines which current generator(s) were active for that sample. Thus the sorting or decoding produces a subset for each current generator, wherein the polarity of the values in the subset indicate the active/inactive state of the current generator for the corresponding samples in the recorded digital signals.

The individual linearity errors, or specific linearity errors, are obtained by subjecting each subset of digital signals to the above procedure. In other words, for each respective subset, a decimation is performed, and/or a Hanning window is applied. After this, a frequency domain transform is applied to the respective subset to generate a frequency domain equivalent. A specific linearity error spectral content or spectrum is extracted from the resulting spectrum by removing therefrom those components at frequencies which are expected to be non-zero, i.e., removing one or more of: (1) the D.C. component; (2) the components associated with a range of frequencies near the frequency of the inputted sine wave, the extent of the range being dependent on purity of the inputted sine wave; (3) the components at higher frequencies containing quantization noise; and (4) components at bins mirrored around the half sampling rate. A specific linearity error, designated by the column vector a(m), is then generated by applying an inverse FFT to the remaining spectrum. The integer index m identifies the particular current generator. The above procedure is performed for each subset, thereby generating a specific linearity error a(m) corresponding to each individual current generator.

Finally, the linearity error correction coefficients c(m) are generated as a function of E and a(m). In one embodiment, the coefficients c(m) are generated by iteratively minimizing a power content between the net linearity error E and the specific linearity errors a(m). In an alternative embodiment, the linearity error correction coefficients c(m) are calculated as a function of the net linearity error spectrum and the specific linearity error spectrums. This embodiment eliminates the need to convert the net linearity error spectrum and the specific linearity error spectrums into the time domain.

In the currently preferred embodiment, the coefficients c(m) are generated by computing the matrix equation:

$$c = (A^T A)^{-1} (A^T E)$$

where c is a column vector with entries comprising the correction coefficients c(m), A is a matrix with columns comprising the specific linearity subsets a(m), and E is the column vector of net linearity error. If there are S samples after decimation and n current generators, vector c has n−1 elements, since one of the current generators is presumed to be ideal, matrix A has S rows and n−1 columns, and vector E has S elements. The particular linear combination of a(m) that most closely equals E, in the least square sense, is given by the coefficient vector c as defined in the above matrix equation.

Once the coefficients are calculated, the linearity error correction circuit may then be configured. The linearity error correction circuit preferably comprises a look-up table which maps digital values output from the A/D converter to new, enhanced values which have reduced linearity errors. The new digital values are calculated as a function of the linearity error correction coefficients c(m). In the preferred embodiment, a respective new digital value is calculated by summing the respective digital value output from the A/D converter with the correction coefficients c(m) corresponding to current generators which are active in producing the respective digital value output from the A/D converter.

The look-up table or correction circuit, once configured, is connected to the output of the A/D converter, e.g., a delta sigma modulator of a delta-sigma converter. For example, in one embodiment, the A/D converter is a delta-sigma converter which comprises a delta-sigma modulator that includes a summing node, a loop filter, a multibit internal A/D, a multi-bit D/A converter and the linearity error correction circuit, preferably a look-up table. The summing node is connected to an analog input signal. The filter applies a low pass function to the output of the summing node. The filtered signal is then converted into a digital equivalent by A/D converter. The D/A converter is positioned in a feed-back loop between the output of the A/D converter and an input of the summing node. Thus, the output of the A/D converter is translated into an analog equivalent and then subtracted from the connected analog input signal at the summing node. Due to the feed-back signal provided, the output of the D/A converter approaches that of the inputted analog signal, if the loop has enough gain. The linearity error correction circuit or look-up table is connected to the output of the A/D converter. The look-up table operates by translating the digital signal output of the A/D converter into an enhanced digital signal, i.e., a digital signal with reduced linearity error.

One advantage of the present invention is that it provides an analog to digital converter with enhanced resolution.

Another advantage of the present invention is that it provides for a reduction in linearity errors in an analog to digital converter.

Yet another advantage of the present invention is that it precludes the need of employing high precision internal digital-to-analog converters within an A/D converter, such as a delta-sigma converter.

BRIEF DESCRIPTION OF THE DRAWINGS

A better understanding of the present invention can be obtained when the following detailed description of the preferred embodiment is considered in conjunction with the following drawings, in which:

FIG. 1 represents a prior art single bit D/S converter in block form;

FIG. 2A represents a prior art single bit D/S converter in schematic form;

FIG. 9 is a block diagram illustrating the DAQ card comprised in the system of FIG. 7, wherein the DAQ card includes a multi-bit D/S converter employing the present invention, and wherein FIG. 9 illustrates normal acquisition operation;

Figure 2B:
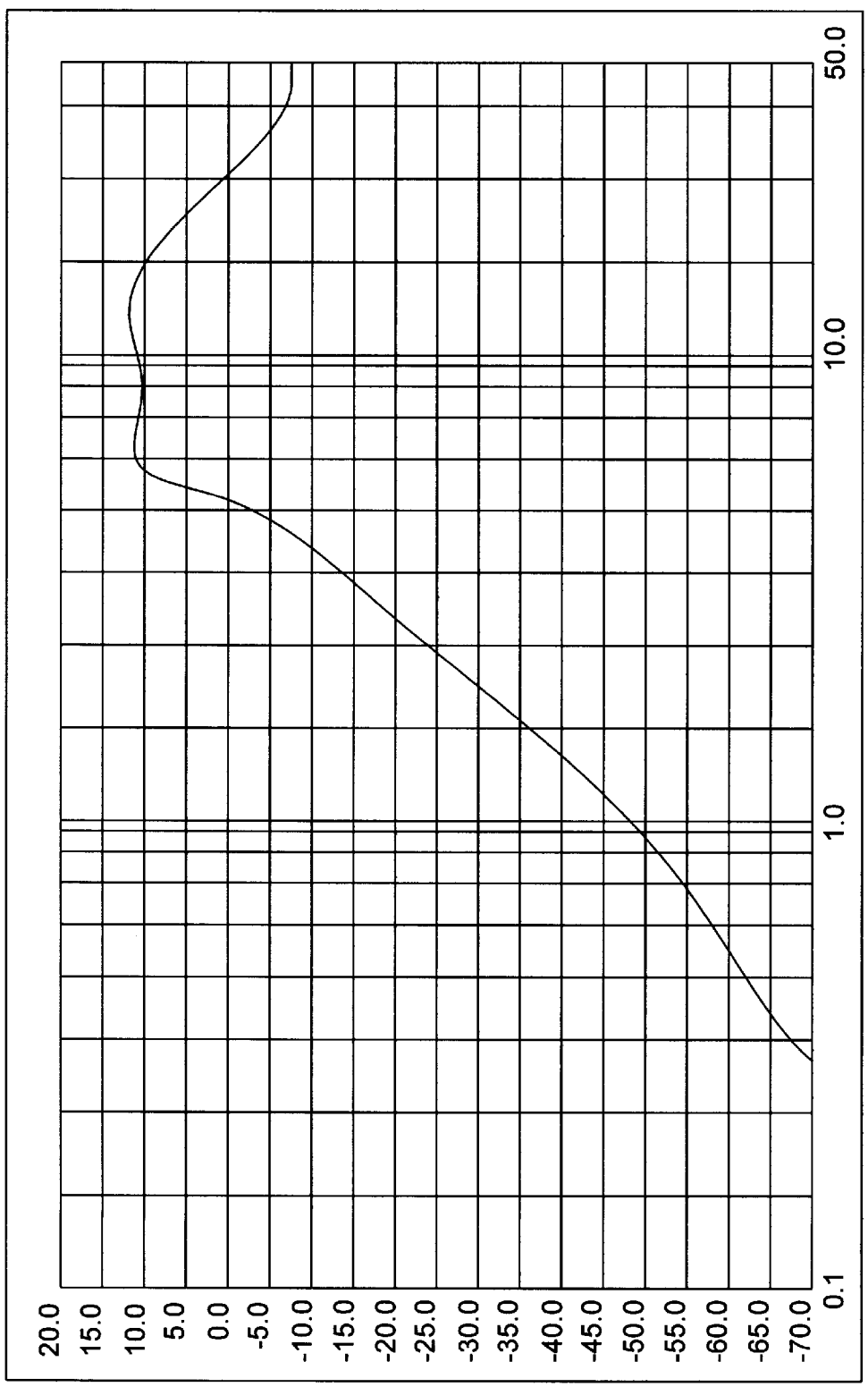
FIG. 2B represents a frequency response of the quantization noise of a D/S modulator.
Figure 3:
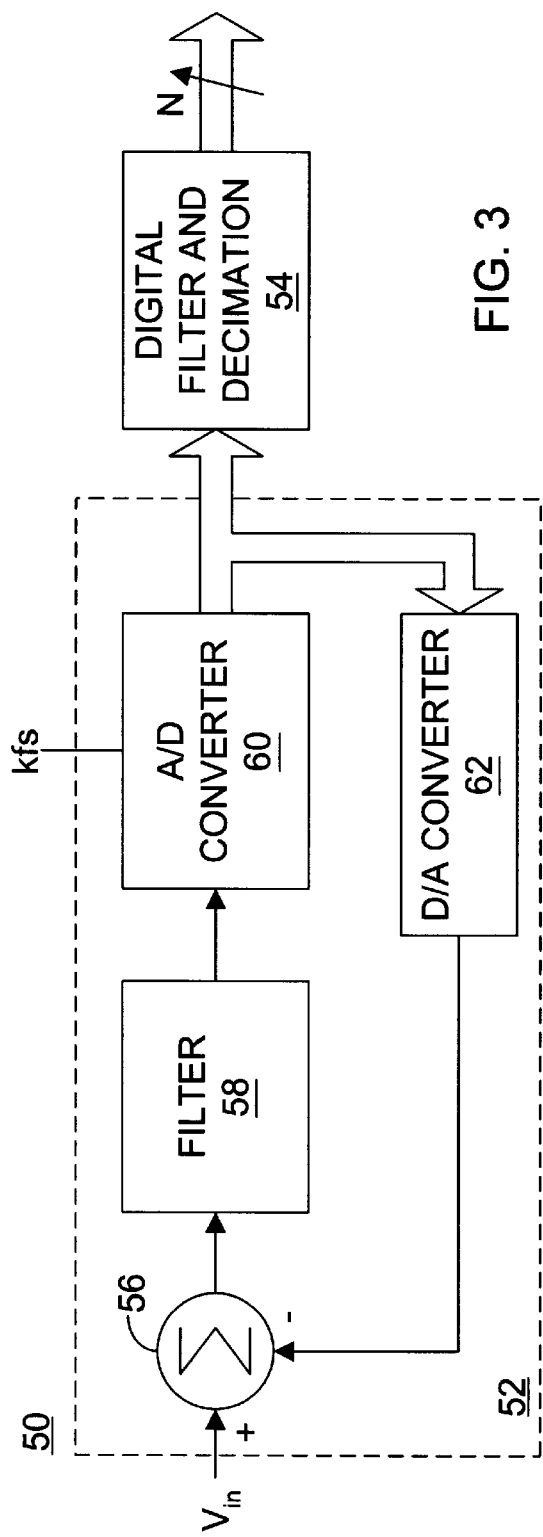
FIG. 3 represents a prior art multi-bit D/S converter in block form.
Figure 5:
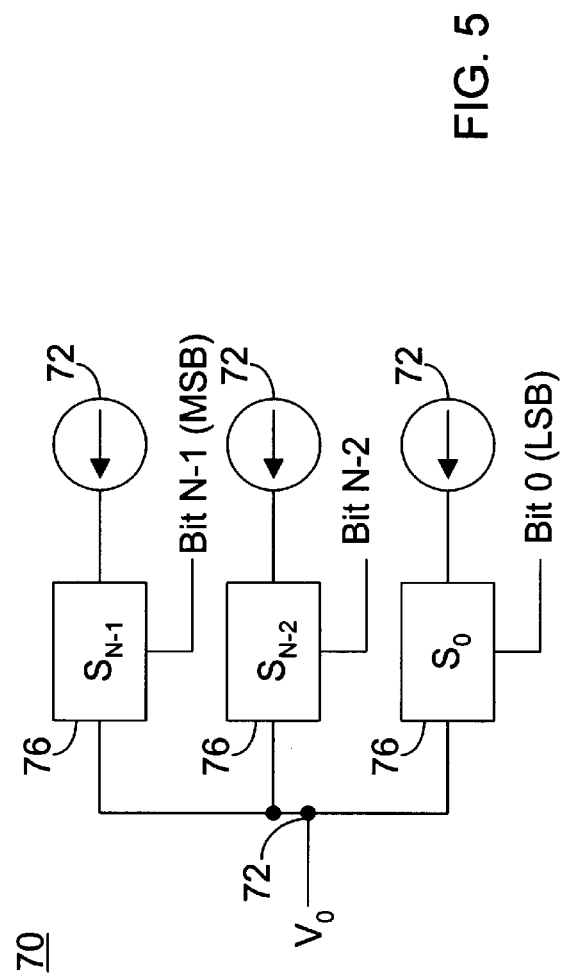
FIG. 5 represents a prior art D/A converter in schematic form.
Figure 4:
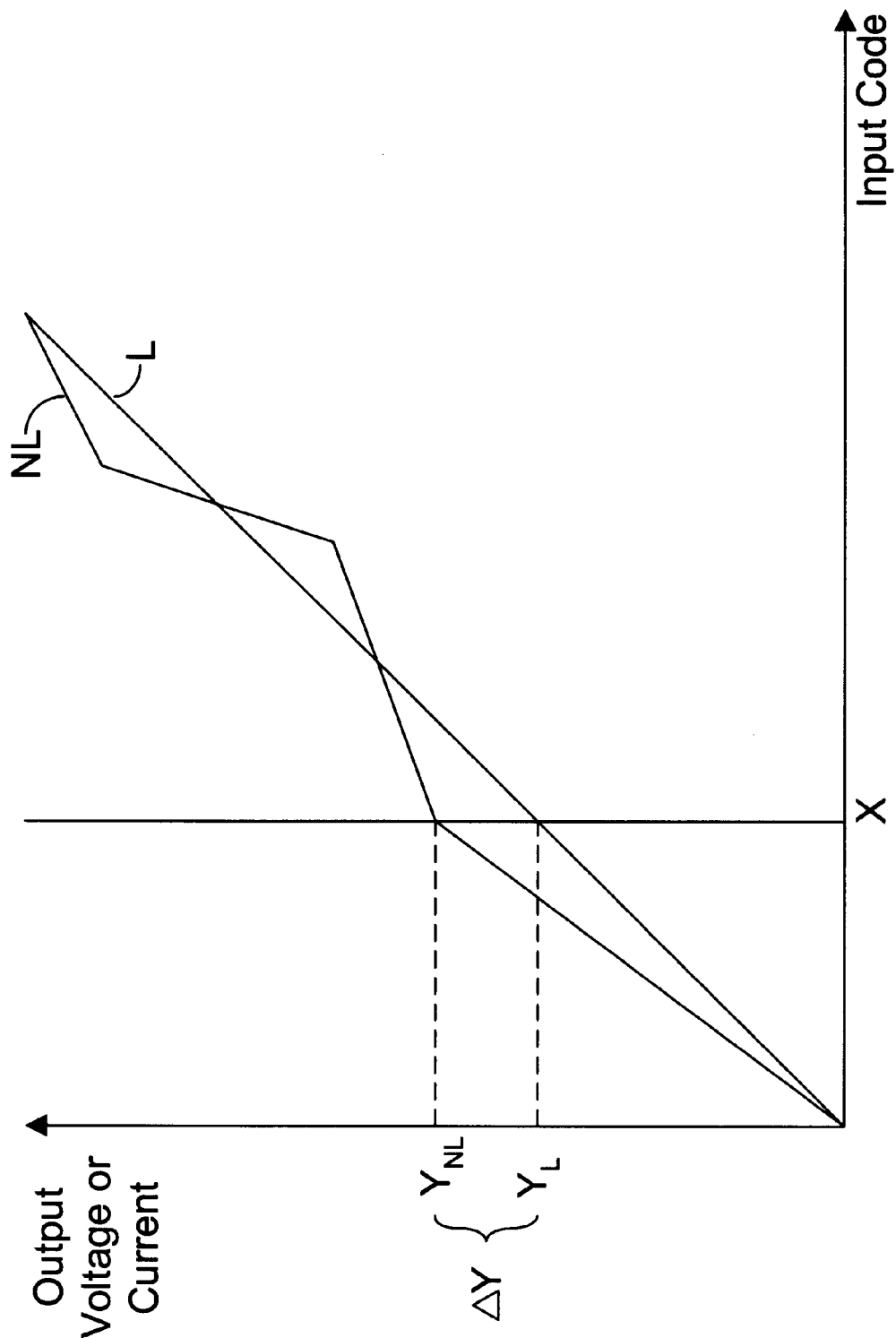
FIG. 4 is a graph representing transfer characteristics of an ideal and a non-ideal multi-bit D/A converter.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIG. 7—DAQ System

Figure 7:
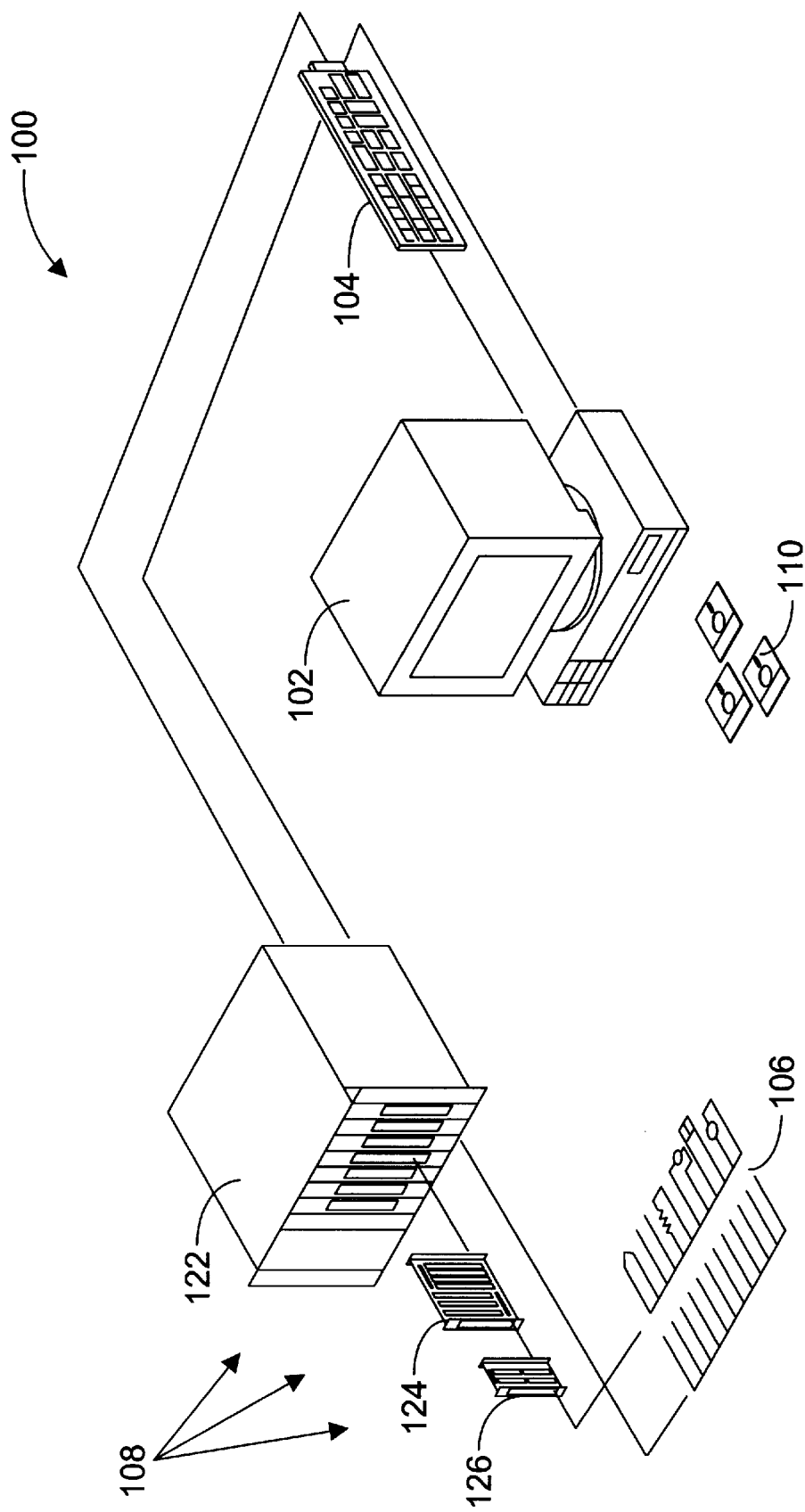
FIG. 7 illustrates a data acquisition (DAQ) data acquisition system which includes the multi-bit D/S converter employing the present invention.

FIG. 7 illustrates a system which includes an analog to digital (A/D) converter employing the present invention. In the preferred embodiment, the present invention is comprised in a data acquisition (DAQ) system. However, the present invention may be included in any of various types of systems where an analog to digital converter is used, i.e., where analog data is converted to digital data. Examples of systems where the present invention may be used include data acquisition systems, instrumentation systems, test and measurement systems, industrial automation systems, process control systems, audio systems, and video acquisition systems, among others.

The present invention may be used with any of various types of A/D converters, including integrating A/D converters, flash A/D converters, sigma-delta A/D converters, sub-ranging A/D converters, and successive approximation A/D converters, among others. The A/D converter includes, for example, one or more internal digital to analog (D/A) converters which generate linearity errors (also referred to as linear errors). In the following description, the present invention is described with reference to a delta-sigma A/D converter as one example of the operation of the present invention. The present invention is preferably used with a delta-sigma A/D converter. However, this description does not limit the invention to use with only delta-sigma (D/S) A/D converters, but rather as noted above the present invention may be used with any of various types of A/D converters.

FIG. 7 shows an illustrative DAQ system 100 according to the present invention. The system 100 comprises a computer 102, a DAQ device or board 104 coupled to the computer 102, and transducers 106 or other detecting means which provide field electrical signals to the DAQ device 104, optionally through signal conditioning circuitry 108. The DAQ board 104 is preferably comprised in the computer system 102, but is shown external to the computer system 102 for illustrative purposes. The term "data acquisition" used in this specification is intended to encompass data generation as well as data acquisition, one example being with reference to instrumentation and process control systems.

The computer 18 includes various standard components, including at least one central processing unit (CPU), non-volatile memory, such as a hard drive, system memory, one or more buses, and a power supply. The computer 102 preferably includes a memory media, such as a magnetic media, e.g., floppy disk(s) 110, or a CD-ROM, on which computer programs according to the present invention are stored. The software programs of the present invention are also stored in the system memory and/or non-volatile memory of the computer 102 and executed by the CPU. The CPU executing code and data from the memory thus comprises a means for configuring and controlling the DAQ device 104 to acquire/generate data from/to the field signals according to the steps described below. In the present disclosure, the terms "memory" or "memory media" are intended to include various types of memory, including installation media such as a CD-ROM, floppy disks 110, or tape drive disks, computer system memory such as DRAM, SRAM, etc., and non-volatile memory such as a magnetic media, e.g., a hard drive, or optical storage, among other types of memory or data storage.

In one embodiment, the computer 102 comprises input/output (I/O) slots into which the DAQ device 104 is coupled. In another embodiment, the computer 102 comprises a VXI (VME Extensions for Instrumentation) chassis and bus, a GPIB (General Purpose Interface Bus), a serial port or parallel port by which the DAQ device 104 is coupled to the computer 102. Examples of computer 102 are IBM-compatible personal computers, Apple Macintosh computers, and Sun Microsystems workstations and operating systems which execute on them.

In one embodiment, the transducers 106 are coupled directly to the DAQ device 104. In another embodiment, the signals received by the transducers 106 are conditioned by the signal conditioning circuitry 108 for presentation to the DAQ device 104 as shown. An example of signal conditioning circuitry 108 is Signal Conditioning Extensions for Instrumentation (SCXI) circuitry. SCXI is an open architecture, multi-channel signal conditioning front-end system for DAQ devices. SCXI comprises an external chassis 122 housing signal conditioning modules 124 and optionally terminal blocks 126 for amplifying, multiplexing, and isolating field signals. The signal conditioning modules advantageously reduce the introduction of noise into the signals transmitted to the DAQ device 104.

The transducers 106 and other detecting means provide the field signals representing a process, physical phenomena, equipment being monitored or measured, etc. to the DAQ device 104. Examples of the transducers 106 are strain gauges, thermocouples, thermistors, photoconductive cells, microphones, and piezoelectric transducers, among others.

Examples of DAQ device 104 are the following products available from National Instruments Corporation: E Series Multifunction I/O boards, such as the AT-MIO-16 series analog input boards, the AT-AO-6/10 series analog output boards, the PC-DIO-96 digital I/O board, and the PC-TIO-10 counter/timer I/O board.

Figure 8:
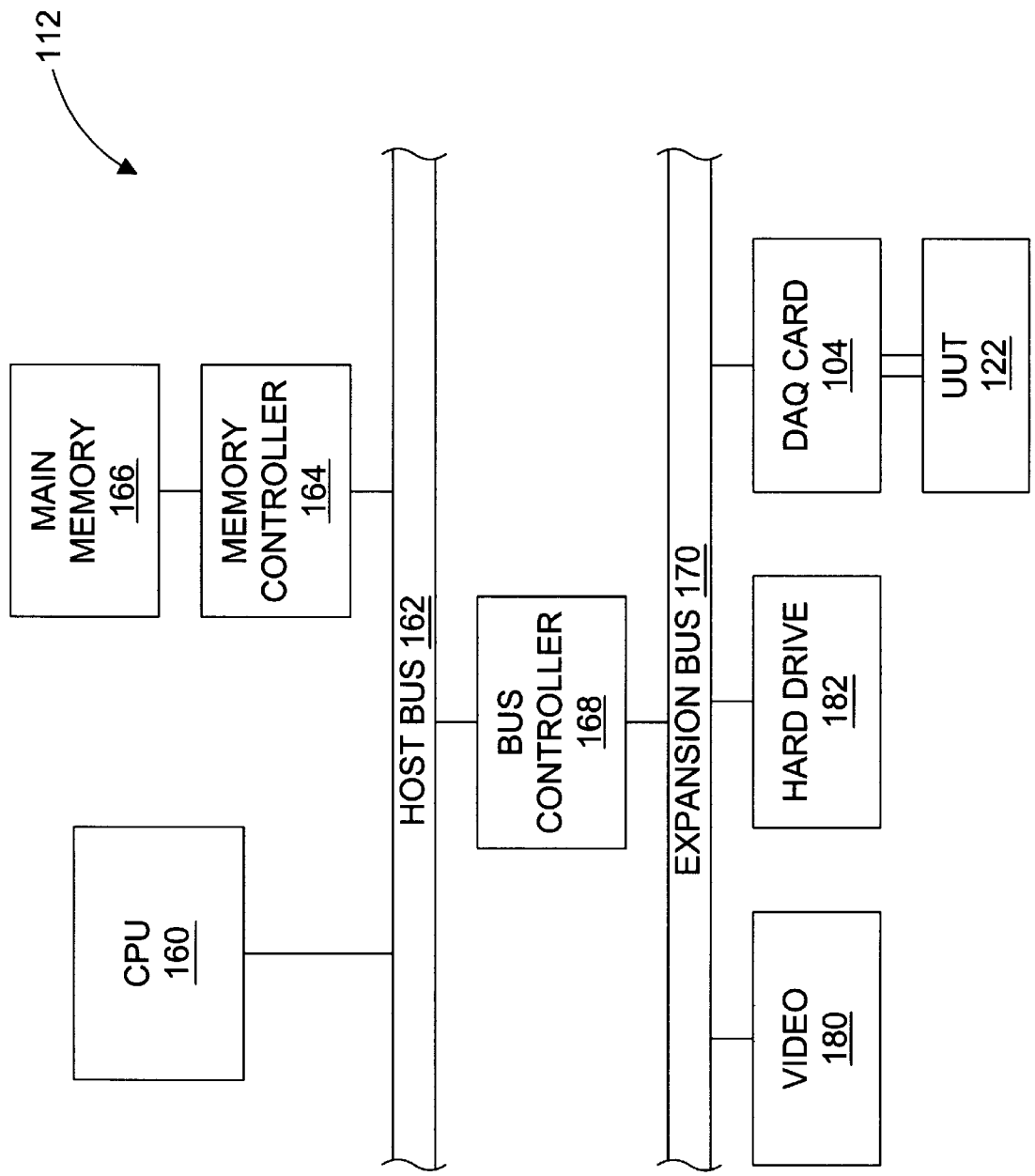
FIG. 8 is a block diagram illustrating the computer system of FIG. 7.

FIG. 8—Computer System Block Diagram

FIG. 8 is a block diagram illustrating an example computer system architecture of the computer system 102 of FIG. 7. FIG. 8 illustrates a representative block diagram of the computer system 102 of FIG. 1. And it is noted that the computer system 102 may have various different architectures, as desired. The elements of a computer system not necessary to understand the operation of the present invention have been omitted for simplicity.

The computer system 102 includes a central processing unit or CPU 160 which is coupled to a processor or host bus 162. The CPU 160 may be any of various types, including an x86 processor such as the Pentium class from Intel, a PowerPC CPU from the Motorola family of processors, as well as others.

Main memory 166, also referred to as system memory 166, is coupled to the host bus 162 by means of memory controller 164. The system memory 166 stores various software used in data acquisition system 100, including DAQ driver level software and a DAQ application. The DAQ driver level software is preferably NI-DAQ software from National Instruments. In the preferred embodiment, the system memory 166 also stores software for configuring the delta-sigma converter comprised on the DAQ card 104. The system memory 166 may store other software, as desired.

Host bus 162 is coupled to an expansion or input/output bus 170 by means of a bus controller 168. The bus controller 168 preferably comprises standard PC chipset logic. The expansion bus 170 is preferably the PCI (Peripheral Component Interconnect) bus, and the bus controller 168 is preferably chipset logic, available from Intel Corporation. The expansion bus 170 includes slots for various devices, including video 180.

A non-volatile memory or hard drive 182 is comprised in the computer system 102 and may be coupled to the expansion bus 170 or to the chipset 168, or to other logic. The non-volatile memory 182 stores an operating system, the DAQ driver software, as well as other application programs, for loading into the system memory 166 as known in the art.

The data acquisition board or device 104 according to the present invention is coupled to the expansion bus 170. The DAQ device 104 is operable to perform communications with an external system or device. The DAQ device 104 is preferably configurable to acquire/generate data from/to an external system or a unit under test. The DAQ device 104 includes the analog to digital (A/D) converter according to the present invention. It is noted that the DAQ device 104 may take various different forms and may be comprised in the computer 102 or external to the computer 102, as desired.

In the preferred embodiment, the present invention is used with a data acquisition system. Thus, as shown, a DAQ interface card 104 is coupled to the expansion bus 170. However, the system and method of the present invention may be used in any of various systems which include an analog to digital converter.

Figure 9:
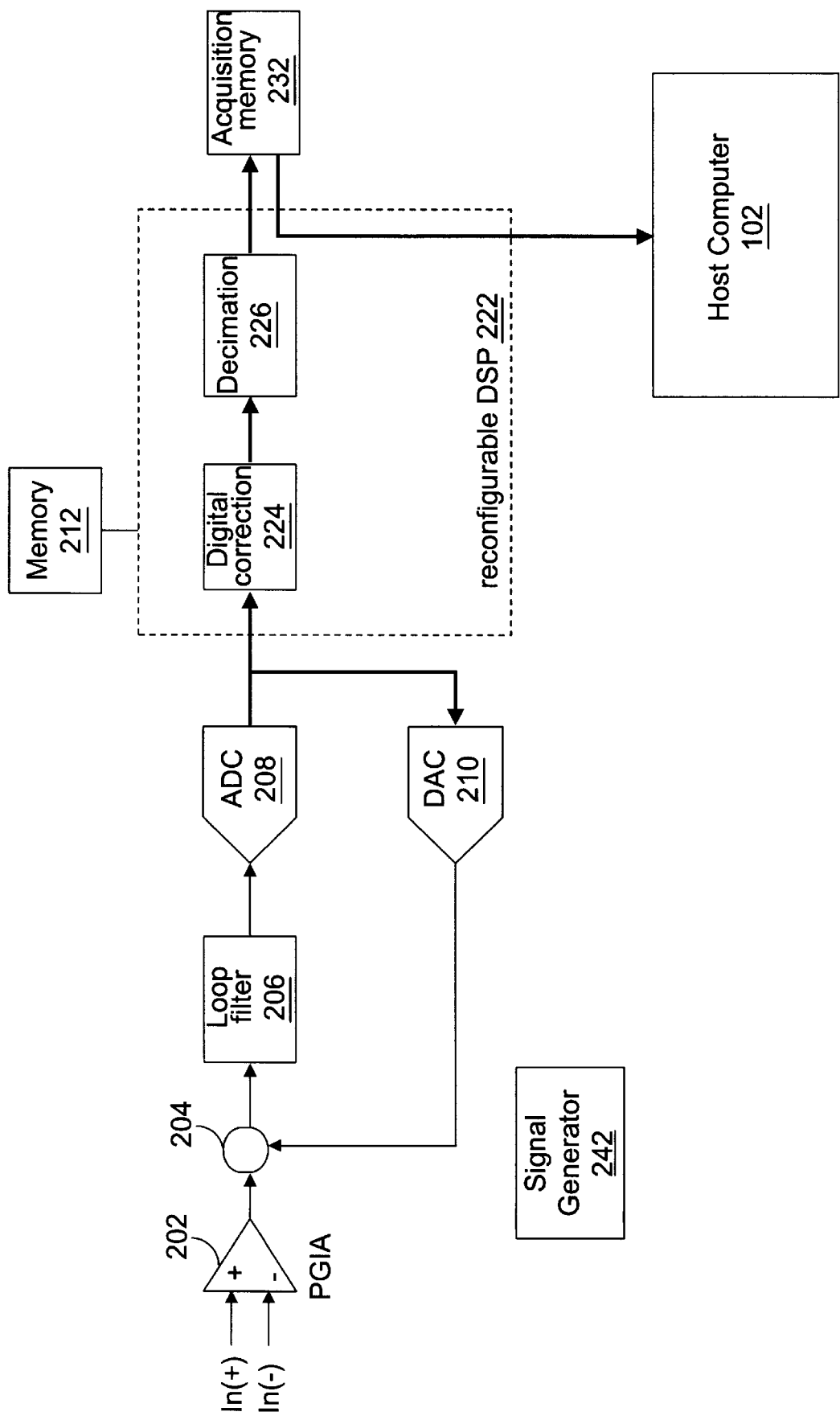

FIG. 9—DAQ Card Block Diagram

FIG. 9 is a block diagram of the DAQ card 104 of FIGS. 7 and 8. More particularly, FIG. 9 shows an example A/D converter, in this case a multi-bit D/S converter, employing the present invention. As noted above, the present invention may be used with any of various types of A/D converters, and in the present description the present invention is described with reference to a delta-sigma A/D converter as one example of the operation of the present invention. However, the present invention readily applies to other types of A/D converters. Circuitry comprised on the DAQ device 104 which is not relevant to the present invention is not shown in FIG. 9 for simplicity.

The DAQ device 104 includes a PGIA (programmable gain instrumentation amplifier) 202 which receives In(+) and In(−) signals. The PGIA couples to the D/S converter of the present invention, which in turn couples to an acquisition memory 232. The acquisition memory is shown coupled to host computer 102. The DAQ device 104 also preferably includes an on-board signal generator 242, preferably a sine wave generator. FIG. 9 illustrates normal operation of the DAQ device 104 when acquiring analog waveforms to the host 102 via the acquisition memory 232.

The D/S converter includes a delta sigma modulator, wherein the delta sigma modulator comprises a summing node 204, a loop filter 206, a multi-bit internal A/D converter 208, and a multi-bit D/A converter 210. The present invention is shown as being employed in a first order, single pole D/S converter. However, the present invention is applicable to other types of D/S converters.

A linearity error correction circuit 224 according to the present invention, and a digital filter and decimation circuit 226, are coupled to the output of the internal A/D converter 208. In the preferred embodiment, a processing unit or DSP 222, such as an FPGA (field programmable gate array) or a programmable digital signal processor (DSP), is coupled to the output of the internal A/D converter 208. When a programmable DSP is used, a memory 212 is coupled to the DSP 222, wherein the DSP 222 executes instructions from the memory. In the preferred embodiment, the processing unit 222 is an FPGA.

Thus, the processing unit 222 operates to perform the digital correction operations of the present invention, preferably through implementation of a look-up table. However, it is noted that the digital correction block 224, also referred to as the linearity error correction circuit or linearity error correction device 224, of the present invention may be implemented in any of various ways, including a processing unit such as a DSP, CPU, microcontroller, etc., a programmable device such as an FPGA, discrete digital or analog logic, or a combination of the above. In the following discussion, the term "DSP" is used to generally refer to the processing unit 222. The DSP 222 preferably operates to perform both the digital correction operation 224 and the decimation operation 226.

The D/S modulator comprising summing node 204, loop filter 206, multi-bit internal A/D converter 208, and multi-bit D/A converter 210, performs in substantially the same manner as prior art multi-bit D/S converters. Namely, filter 206 applies a low-pass filter function to the output of summing node 204. The filtered signal in turn is converted into a digital equivalent by A/D converter 208. D/A converter 210 is positioned in a feedback loop between the output of the A/D converter 208 and an input of the summing node 204. Thus, the output of the D/A converter 210 is translated into an analog equivalent which is subtracted from analog input signal $V_{in}$ inputted to summing node 204. Due to the feedback signal provided, the output of the D/A converter 210 approaches that of the input signal if the loop has enough gain.

As shown, the linearity error correction (digital correction) block 224 and the digital filter and decimation block 226 are placed in series between the D/S modulator and the acquisition memory 232. The digital filter and decimation circuit block 226, as implemented by DSP 222, preferably operates substantially in the same way as prior art digital filter and decimation circuits. Namely, the digital filter and decimation block 226 provides low-pass digital filtering and a resampling of the digital signals inputted thereto, where the resampling occurs at a rate $f_s$.

Linearity error (L/E) correction block or circuit 224 is connected to the output of the D/S modulator. Digital signals generated by the D/S modulator are corrected or linearized by the L/E correction circuit 224 before being digitally filtered and decimated. The L/E correction block 224 linearizes the D/S modulator 82 by removing or substantially reducing the linearity errors in output digital signals. The L/E correction block 224 removes or reduces linearity errors by adjusting the output of the D/S modulator to compensate for the linearity error. In particular, in the preferred embodiment the L/E correction circuit 224 utilizes a look-up table to map values output from the D/S modulator which have linearity errors, to new values with reduced linearity errors. Given that the L/E correction circuit 224 linearizes the D/S modulator 82, the D/S converter 80 employing the present invention ultimately produces a digital signal having reduced linearity errors and a higher resolution. Accordingly, the number of bits representing the digital output of the digital filter and decimator 226 can be enhanced or increased.

The on-board sine wave generator 242 may be selectively coupled to the input of the summing node to provide a sine wave input to the D/S converter, as discussed further below.

In the preferred embodiment, the gain of filter 206 is set sufficiently high for the following reasons. The transfer function for the D/S modulator 82 can be defined as:

$A/(1+AB)$, where A defines a gain of filter 206, and B defines a transfer function of D/A converter 210. If the gain A of the filter 206 is made sufficiently high at low frequencies, the transfer function of the D/S modulator reduces to:

$1/B$.

According to the present invention, the L/E correction circuit 224 is configured to have a transfer profile substantially equal to B, and L/E correction circuit 224 thus offsets or otherwise reduces the linearity error introduced by the D/A converter, since the digital correction circuit 224 is connected in series with the D/S modulator.

Figure 10:
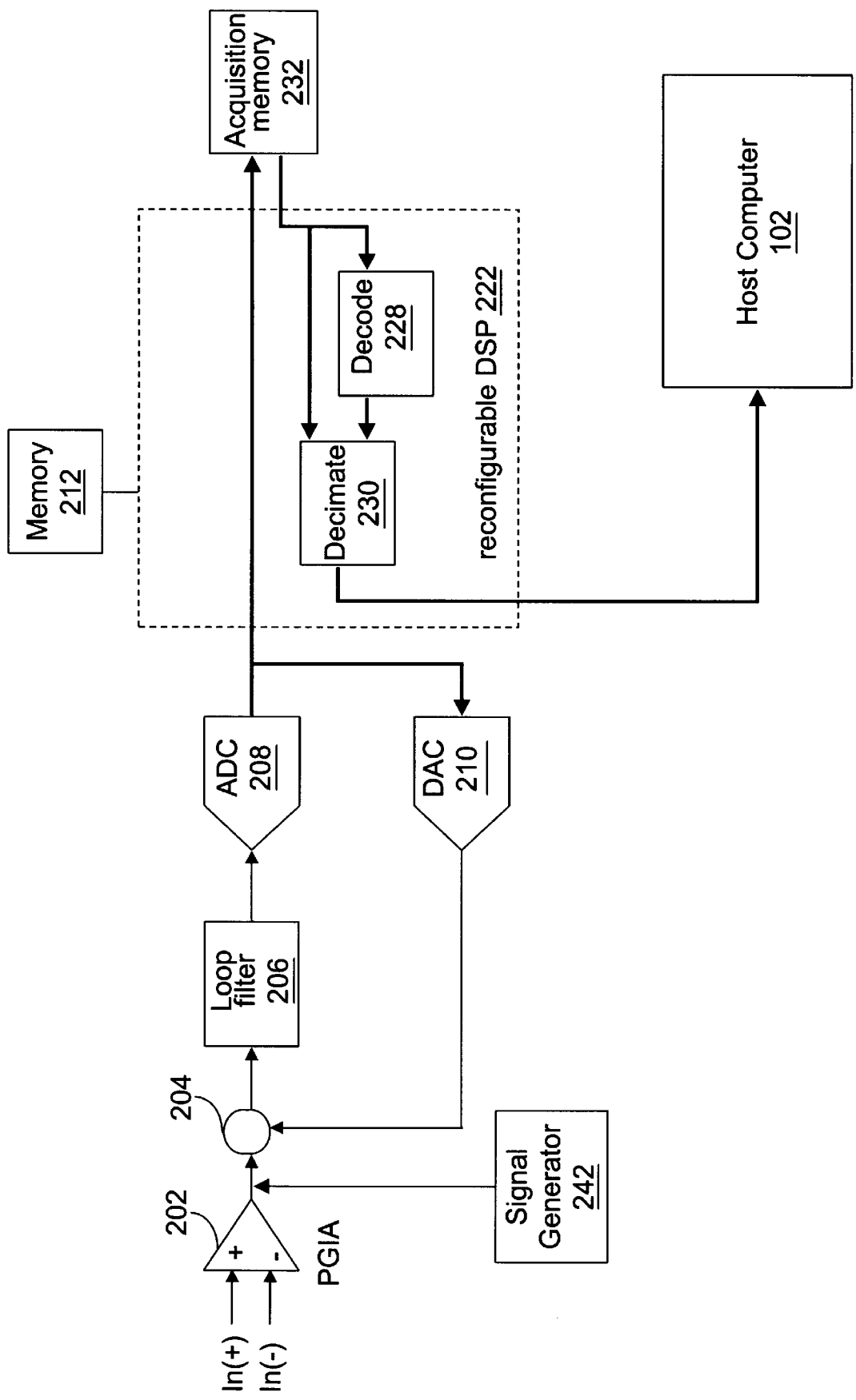
FIG. 10 is a block diagram illustrating the DAQ card configured for calibration according to the present invention.

FIG. 10—D/S Converter Configured for Calibration

FIG. 10 illustrates the D/S converter of FIG. 9, wherein the DSP 222 is configured to perform calibration according to the present invention. During calibration, the signal generator or sine wave generator 242 is selectively connected to the input of the summing node 204. The signal generator 242 operates to provide a pure sine wave to the input of the D/S converter. The D/S converter receives the sine wave and generates a plurality of samples S, which are recorded in the acquisition memory 232.

As shown, the DSP 222 is programmed to perform a decimation function 230 on the recorded samples S and provide the decimated samples to the host computer 102 for processing. The DSP 222 is also programmed to perform a decode function 228 on the recorded samples S to sort the signals into subsets corresponding to each of the current generators comprised in the D/S converter. After the sorting performed by the decode block 228, the decimation block 230 decimates each of the subsets and provides the decimated subsets to the host computer 102 for processing.

As discussed below, the host computer 102 operates to extract linearity error information from these received signals and in response generate linearity error correction coefficients. The host computer 102 preferably extracts linearity error information from these received signals by performing a frequency domain transform on the received signals, performing linearity error spectrum removal, and then performing an inverse frequency domain transform. The host computer 102 preferably generates linearity error correction coefficients through an iteration algorithm or a least squares matrix multiplication.

The linearity error correction coefficients are then used to program the DSP 222, i.e., the digital correction block 224, to perform digital correction on the output of the D/S modulator. In the preferred embodiment, the linearity error correction coefficients are then used to generate a look-up table in the memory 212, which is used by the DSP 222 when performing linearity error correction 224.

In an alternate embodiment, a processor located on the DAQ device 104, such as the DSP 222, operates to extract linearity error information from the received signals and in response generate linearity error correction coefficients. Alternatively, a programmable digital analyzer (not shown) external to the DAQ device 104 may be used to perform this function, as desired.

Figure 17:
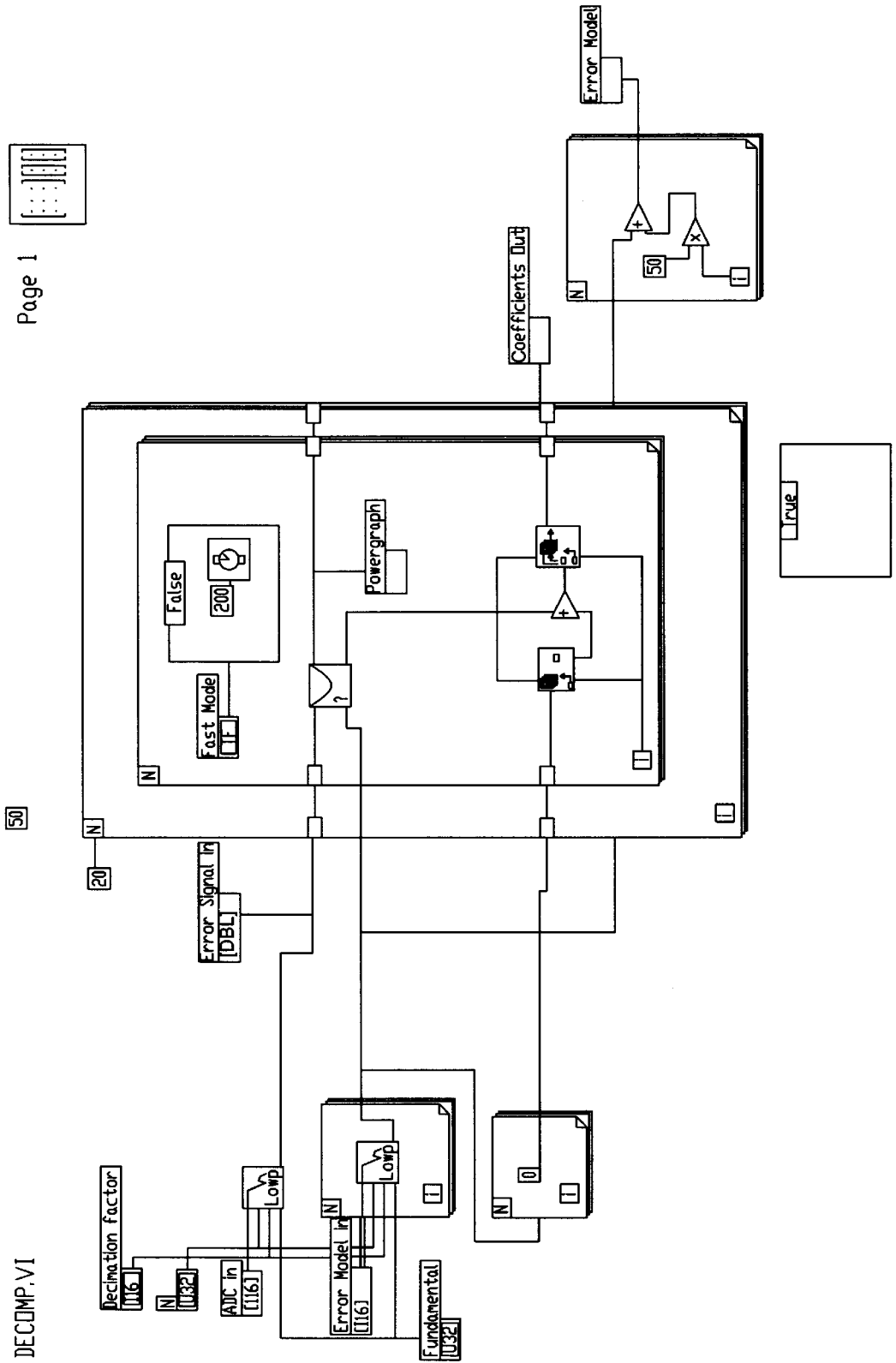
FIG. 17 illustrates one implementation of a graphical program which performs the method of the present invention.
Figure 18:
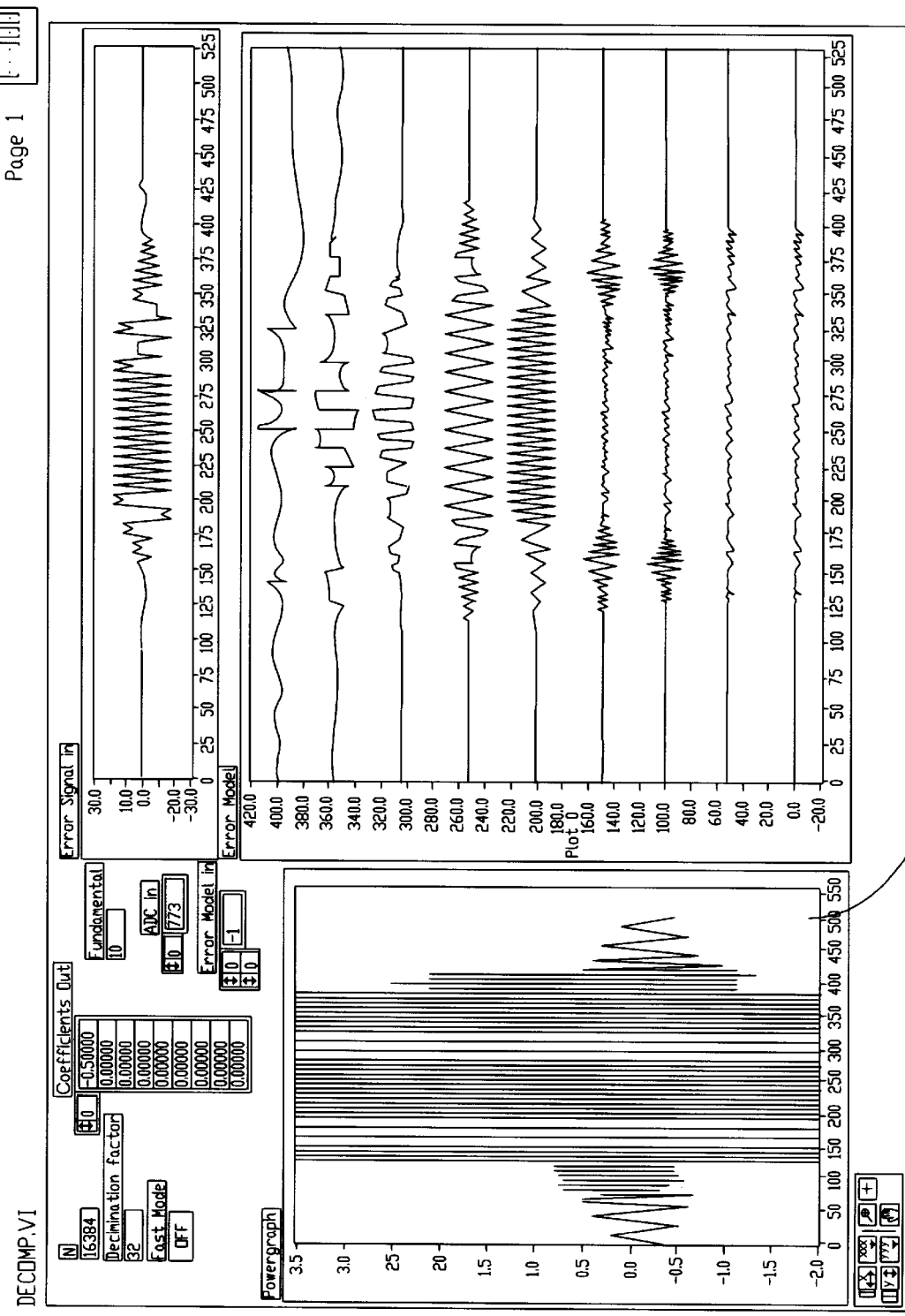
FIGS. 18–23 illustrate successive reductions in the power content of E using the iteration shown in FIG. 14.
Figure 19:
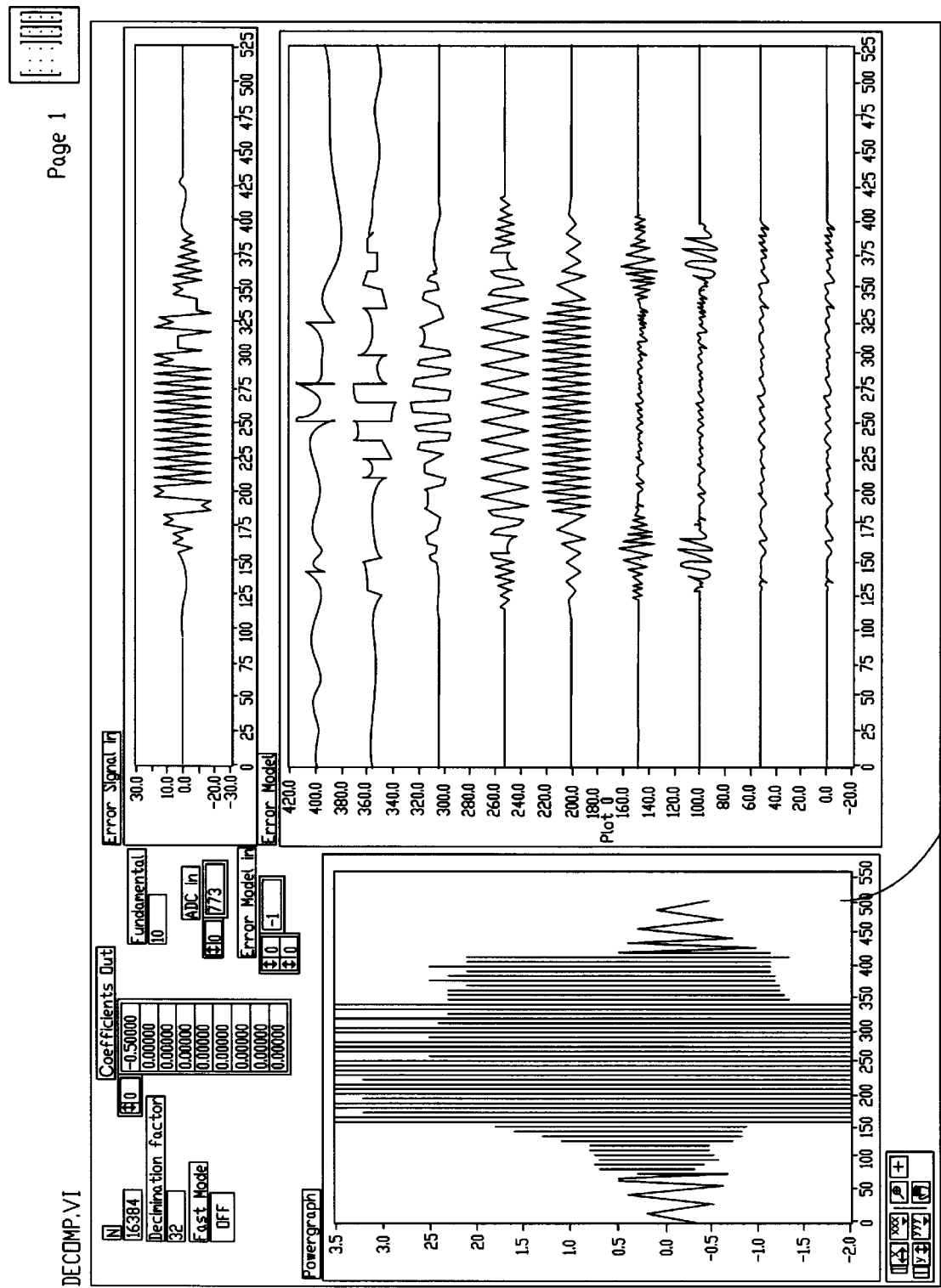
Figure 20:
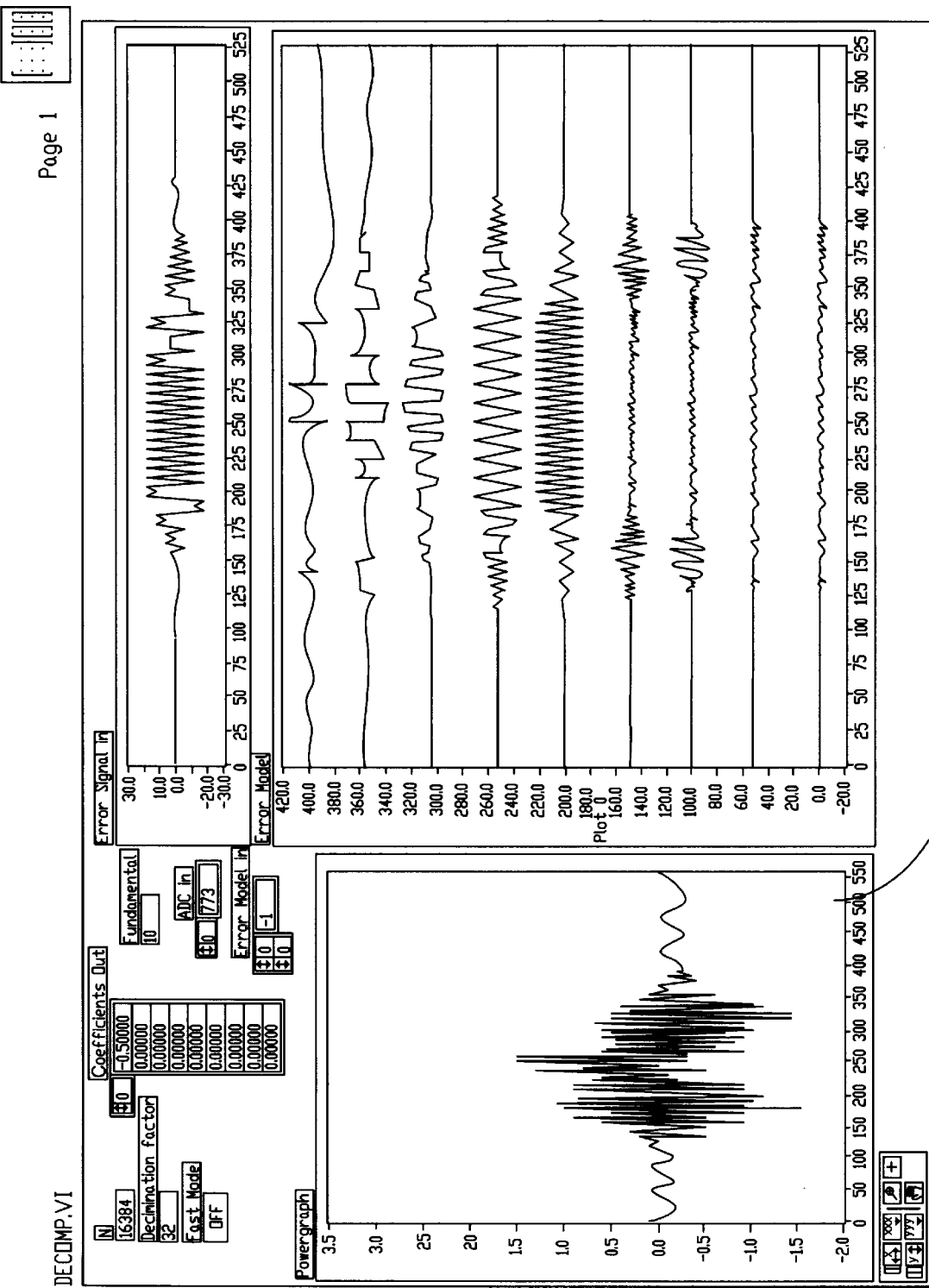
Figure 21:
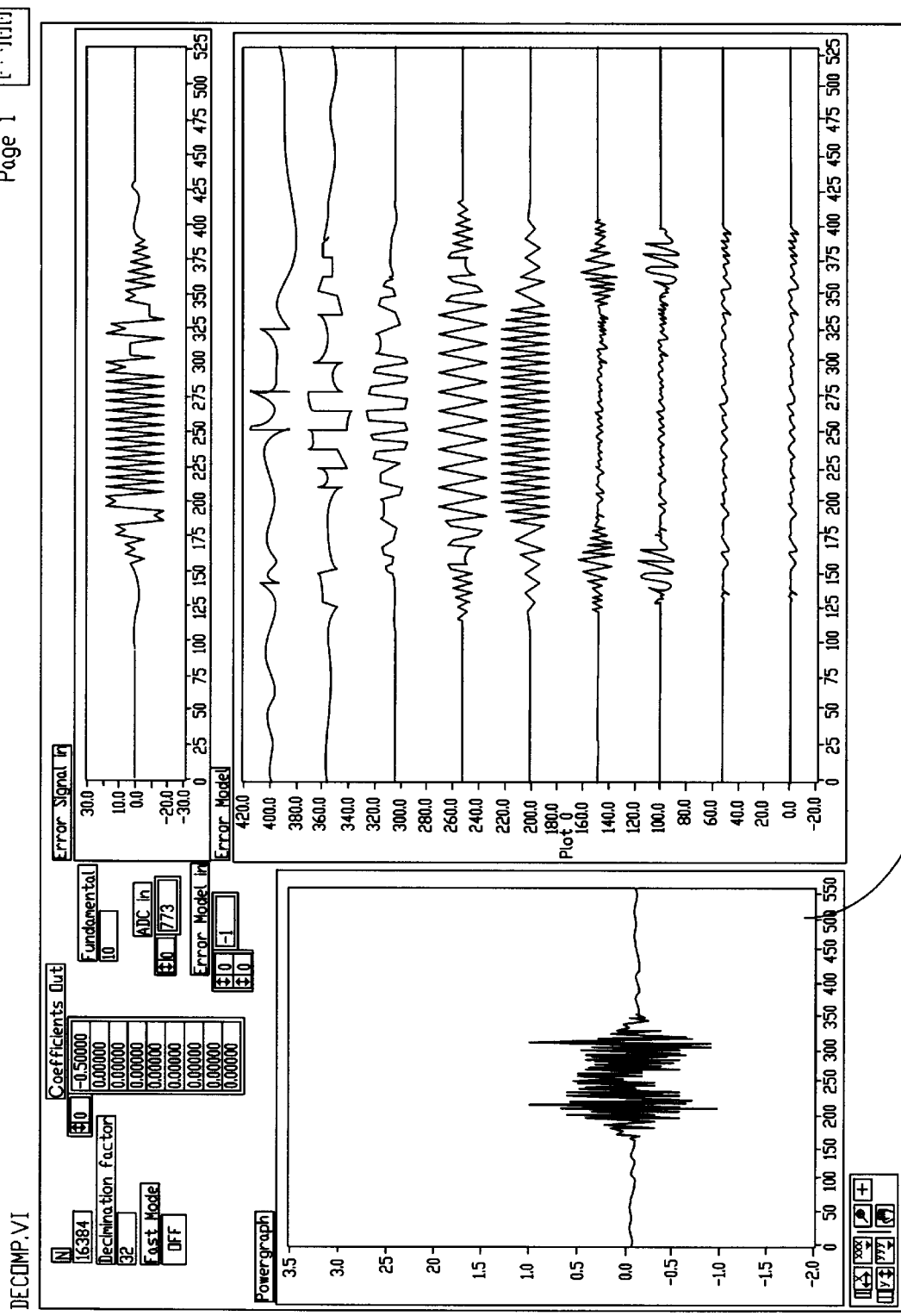
Figure 22:
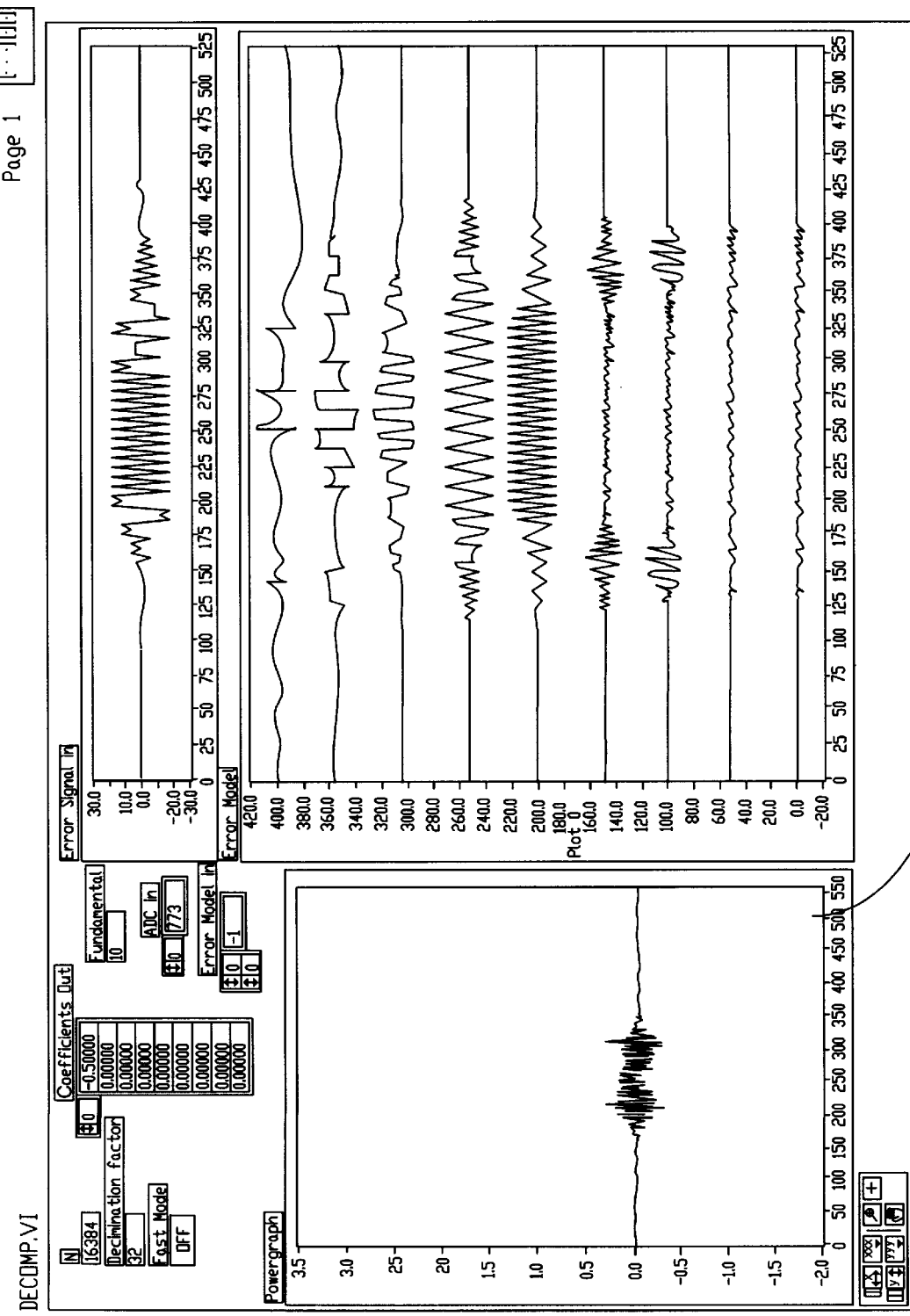
Figure 23:
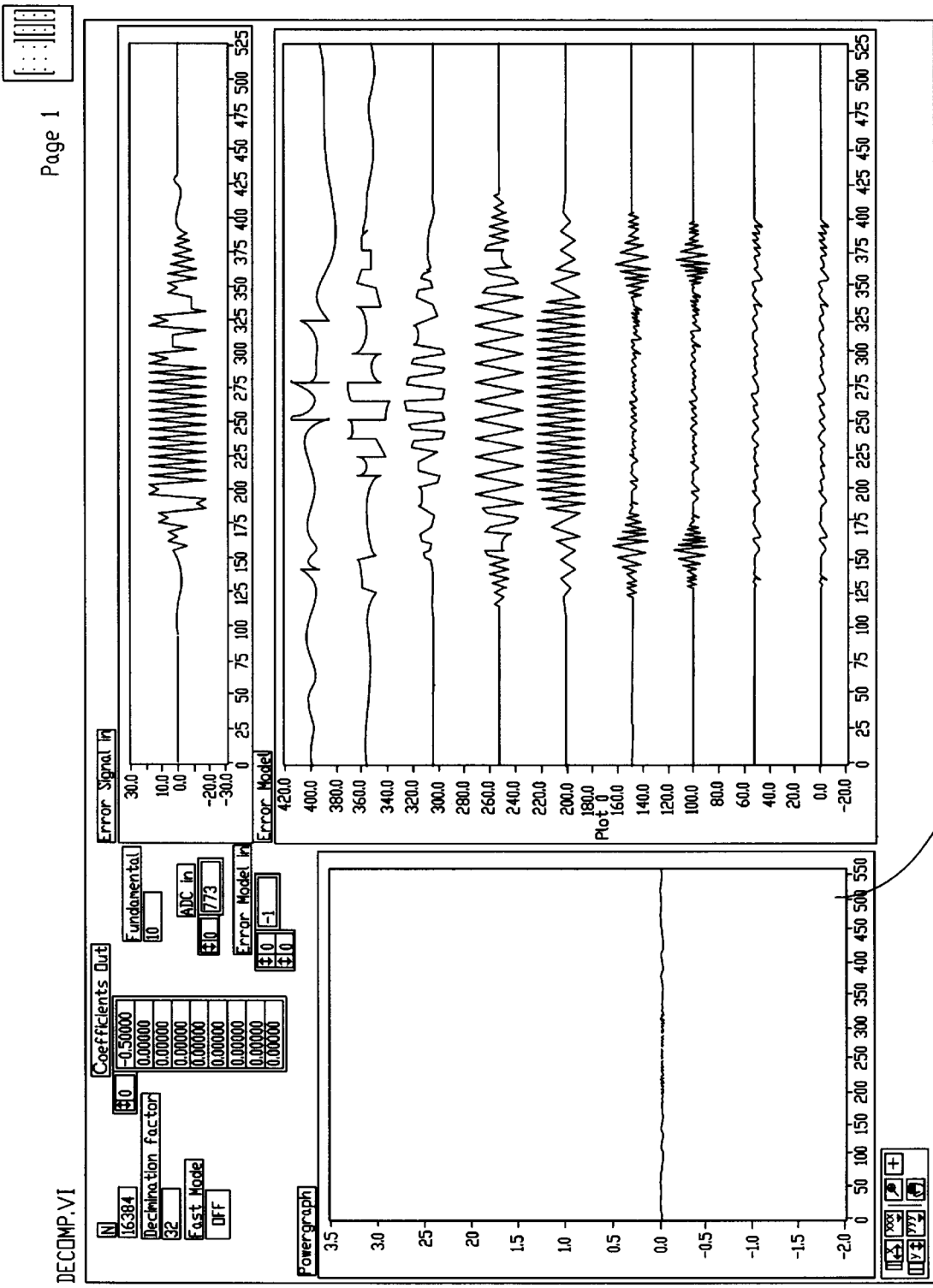

FIG. 17 shows a LabVIEW implementation of software executed by the host computer 102 in performing extraction of linearity error information from the received signals and generation of linearity error correction coefficients.

After the calibration operation has been completed, the signal generator 242 is disconnected from the input of the D/S converter, and the D/S converter is configured as shown in FIG. 9 for data acquisition operations using the newly configured digital correction block 224, i.e., using the configured DSP 222 and memory 212.

With continuing reference to FIGS. 10 and 17, and with further reference to FIGS. 11 through 16, the L/E correction circuit 224 and operation of the DSP 222 and host computer 102 will now be more fully explained.

Figure 11:
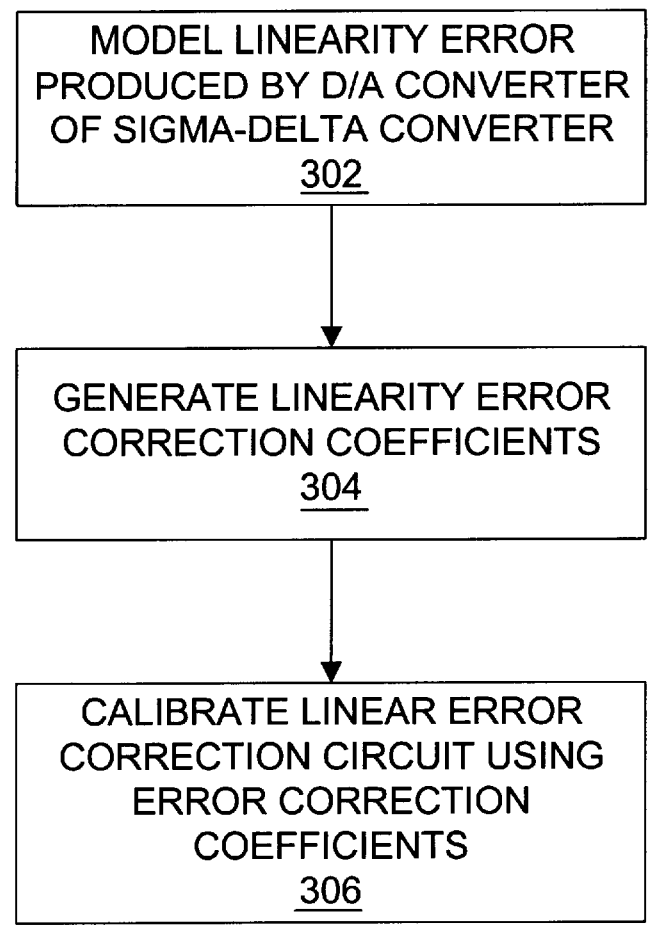
FIG. 11 is a top level flowchart which illustrates the method of the present invention.

FIG. 11—Top Level Flowchart

FIG. 11 shows, in general terms, application of the present invention to a conventional multi-bit D/S converter.

In step 302 the DSP 222 and/or host computer 102 model the linearity error inherent in the D/A converter 210. The linearity error modeling performed in step 302 is shown in more detail in FIG. 12, as well as FIGS. 13, 14 and 15.

Based on the linearity error modeling, the host computer 102 generates correction coefficients in step 304. Thus, in the preferred embodiment, the host computer 102 generates the correction coefficients in software. However, it is noted that the correction coefficients may be generated by the board 104, either in hardware or software, or by a combination of the DAQ device 104 and host computer 102, or by an external system. The generation of correction coefficients is shown in more detail in FIG. 16.

Thereafter, in step 306, the linearity error correction coefficients are used to configure or calibrate the L/E correction circuit 224 comprised on the board 104. In the preferred embodiment, as discussed above, the DSP 222 implements the L/E correction circuit 224.

Once the L/E correction circuit 224, i.e., the DSP 222, is properly configured, the delta sigma converter may be used for analog to digital conversion. Thus, as shown in FIG. 9, an input voltage $V_{in}$ is applied to the delta-sigma converter input summing node 204, $V_{in}$ is digitally sampled, and the digital samples are provided to the DSP 222 for LIE correction. The DSP 222 in turn translates the digital samples into values with reduced linearity errors.

Figure 14:
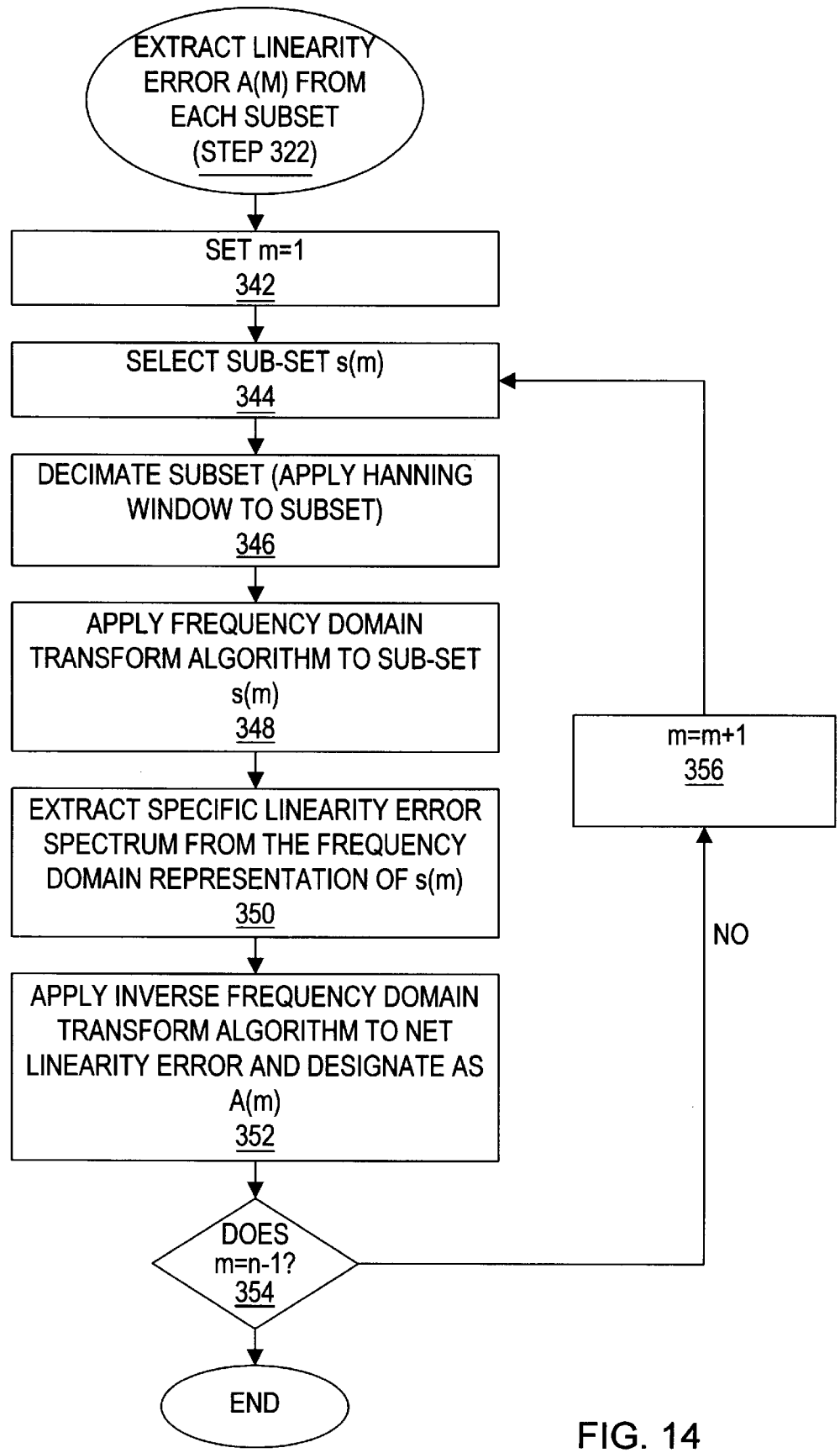
Figure 15:
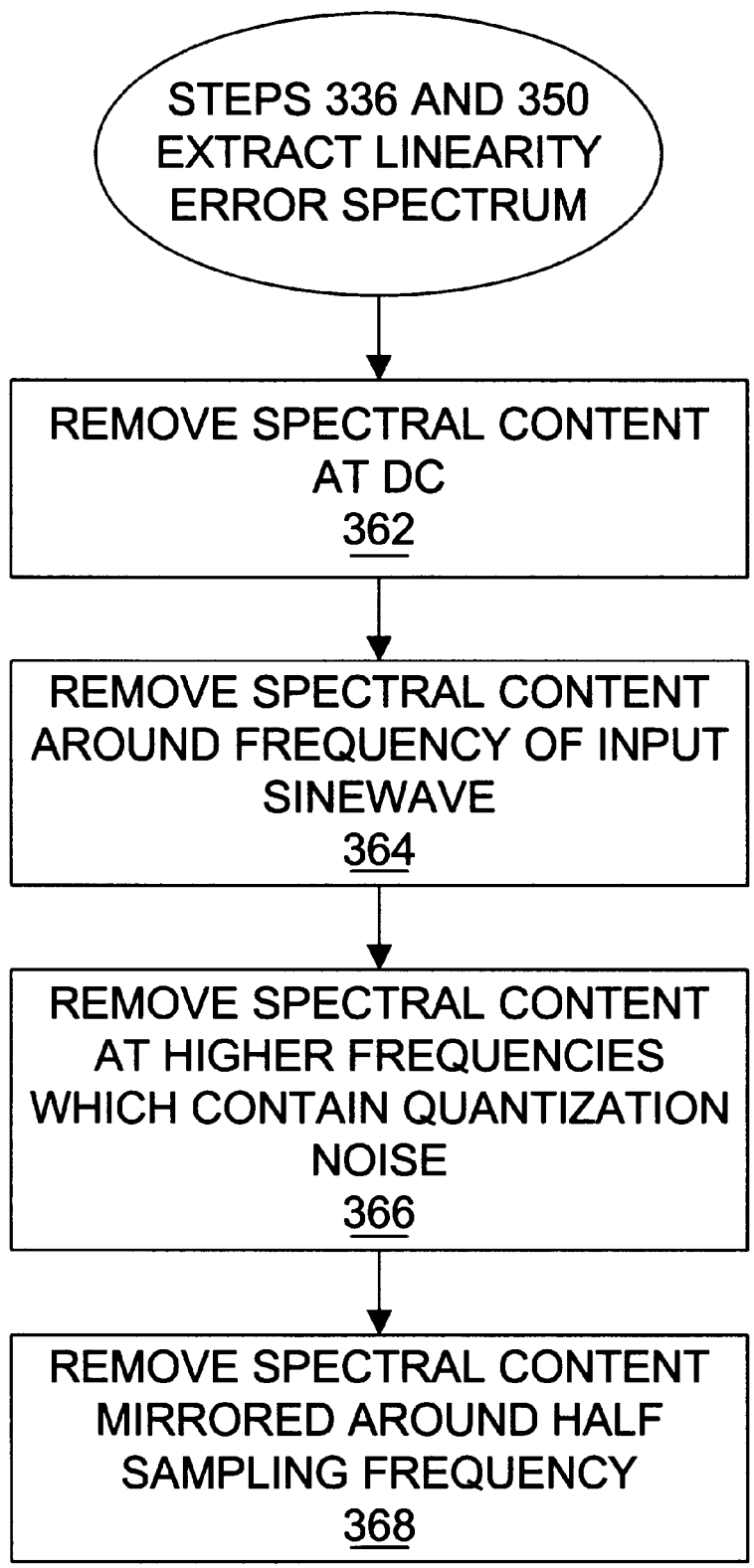
FIG. 15 is a more detailed flowchart which illustrates a method of extracting linearity error.
Figure 16:
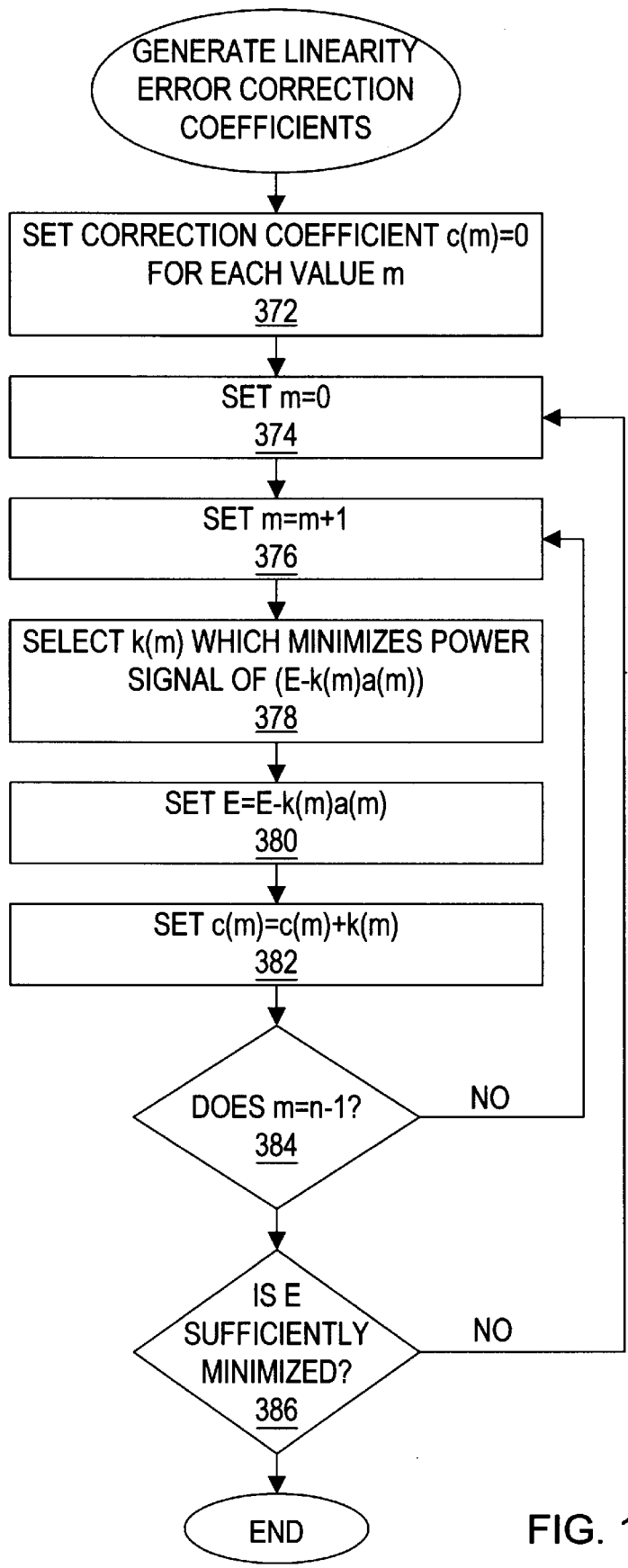
FIG. 16 is a flowchart illustrating generation of the linearity error correction coefficients.

FIGS. 12 through 16 are flowchart diagrams which illustrate how the linearity error is modeled in step 302, and how the linearity error correction coefficients are generated in step 304. More specifically, FIGS. 12–15 illustrate how the linearity error is modeled, and FIG. 16 illustrates how the linearity error correction coefficients are generated.

Figure 12:
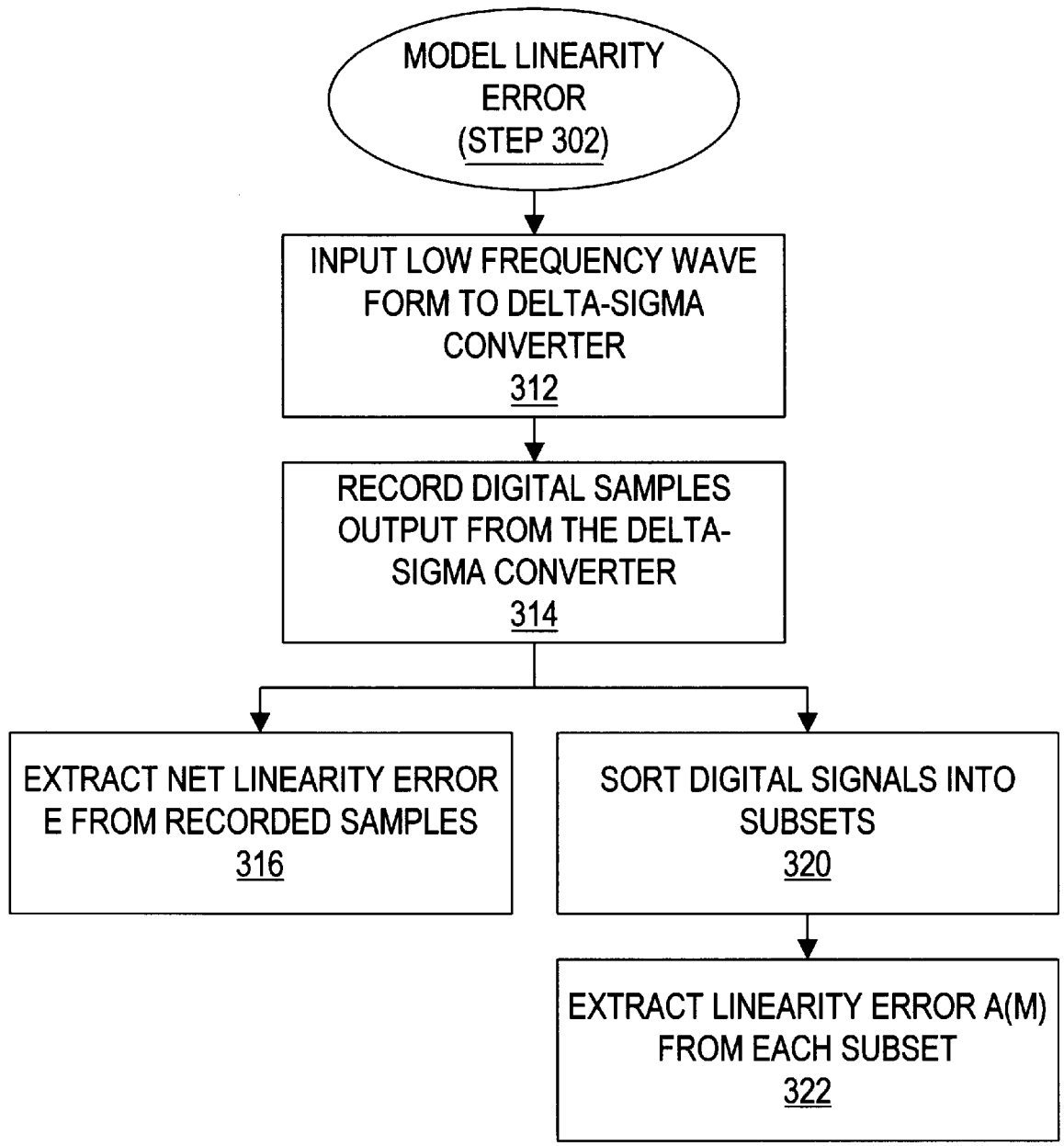
FIGS. 12–14 are a more detailed flowchart diagram illustrating how linearity errors are modeled or extracted according to the method of the present invention.

FIG. 12—Modeling of Linearity Errors.

With continuing reference to FIG. 10, FIG. 12 illustrates operation of step 302 of FIG. 11, i.e., FIG. 12 illustrates modeling of linearity errors performed in step 302 of FIG. 11. As shown, in step 312 a known waveform is input to the D/S modulator by selectively connecting the waveform generator 242 to the input of summing node 204. The waveform input to the D/S modulator is preferably a pure sine wave, although other types of analog waveforms may be used. The pure sine wave is generated at a predetermined frequency $f_{sw}$.

In step 314 the acquisition memory 232 collects and stores a set S of digital samples of the output waveform generated by the D/S modulator. Here it is noted that digital correction 224 and decimation 226 are not performed on the output of the D/S modulator, but rather the digital samples are recorded directly in the acquisition memory 232.

After the set S of digital samples or digital signals are recorded in step 314, in step 316 the method extracts a net linearity error E from the recorded set S of digital samples. Step 316 is preferably performed by the host computer system 102. Step 316 is more fully explained in the flowchart of FIG. 13.

Also, after the set S of digital samples are recorded in step 314, in step 320 the method sorts or decodes the recorded set S of digital samples into subsets of digital samples or values. In the preferred embodiment, the DSP 222 sorts the digital samples into subsets s(m) for m=1 to n−1 at step 320. In a preferred embodiment of the present invention, n−1 subsets of digital samples are selected, where n equals the number of current generators contained within the D/A converter 210. In the preferred embodiment, the DSP 222 sorts the digital samples into n−1 subsets because one of the current generators is presumed to be ideal. In the preferred embodiment, the current generator with the highest current value is selected to be the ideal generator.

In this configuration, each subset group s(m) corresponds to a single current generator being switched to a summing node within the D/A converter 210. Each subset value s(m), i.e., each value in the subset, corresponds to a unique setting of a generator internal to the D/A converter 210 for the respective or corresponding sample of the recorded set S of digital samples, i.e., each value (1 or 0) comprised in a subset corresponds to state of a unique current generator internal to the D/A converter 210 for the respective sample in the set S. Stated another way, each of the values in a subset s(m) corresponds to the state of the respective current generator for a corresponding sample of the recorded set S of digital samples. Therefore, for each digital sample in the recorded set S of digital samples, the sorting or decoding operation in step 320 produces a value for each subset s(m) for m=1 to n−1, wherein the value produced corresponds to the active state of the respective current generator which corresponds to the subset. Thus, each subset s(m) of digital samples contains linearity error information associated solely with a distinct, single current generator in the D/A converter 210. The sorting or decoding operation in step 320 is preferably performed by the DSP 222, i.e., by the decode block 228 implemented by DSP 222.

After the recorded set S of digital samples are sorted into subsets in step 320, in step 322 the method extracts a net linearity error a(m) from each of the subsets s(m). Step 322 is preferably performed by the host computer system 102 and is similar to the operation performed in step 316. Step 322 is more filly explained in the flowchart of FIG. 14.

Figure 13:
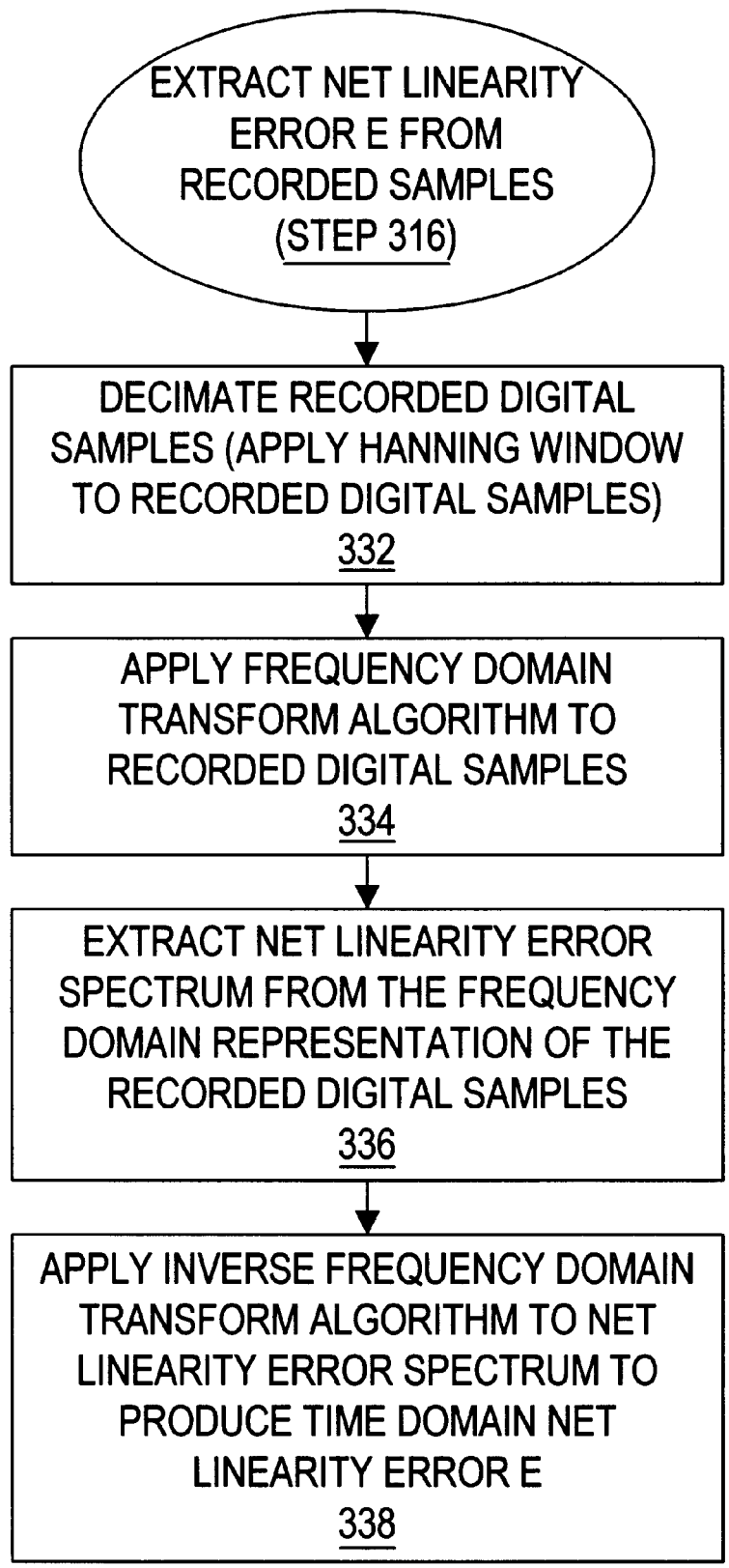

FIG. 13—Extracting the Net Linearity Error E (Step 316 of FIG. 12)

FIG. 13 illustrates step 316 of FIG. 12, wherein the method operates to extract the net linearity error E from the recorded samples.

As shown, in step 332 the method decimates the recorded digital samples, i.e. applies a low pass filter to the recorded digital samples. The decimation is performed to remove high frequency components of the spectrum. The decimation operation in step 332 is preferably performed by the DSP 222, i.e., by the decimate block 230 implemented by DSP 222. Alternatively, a Hanning window may be applied to the recorded digital samples.

In step 334 the method applies a frequency domain transform algorithm to the recorded set S of digital samples, after the set S has been decimated in step 332. In the preferred embodiment, the set S of digital samples are transformed using a Fast Fourier Transform algorithm.

Figure 6:
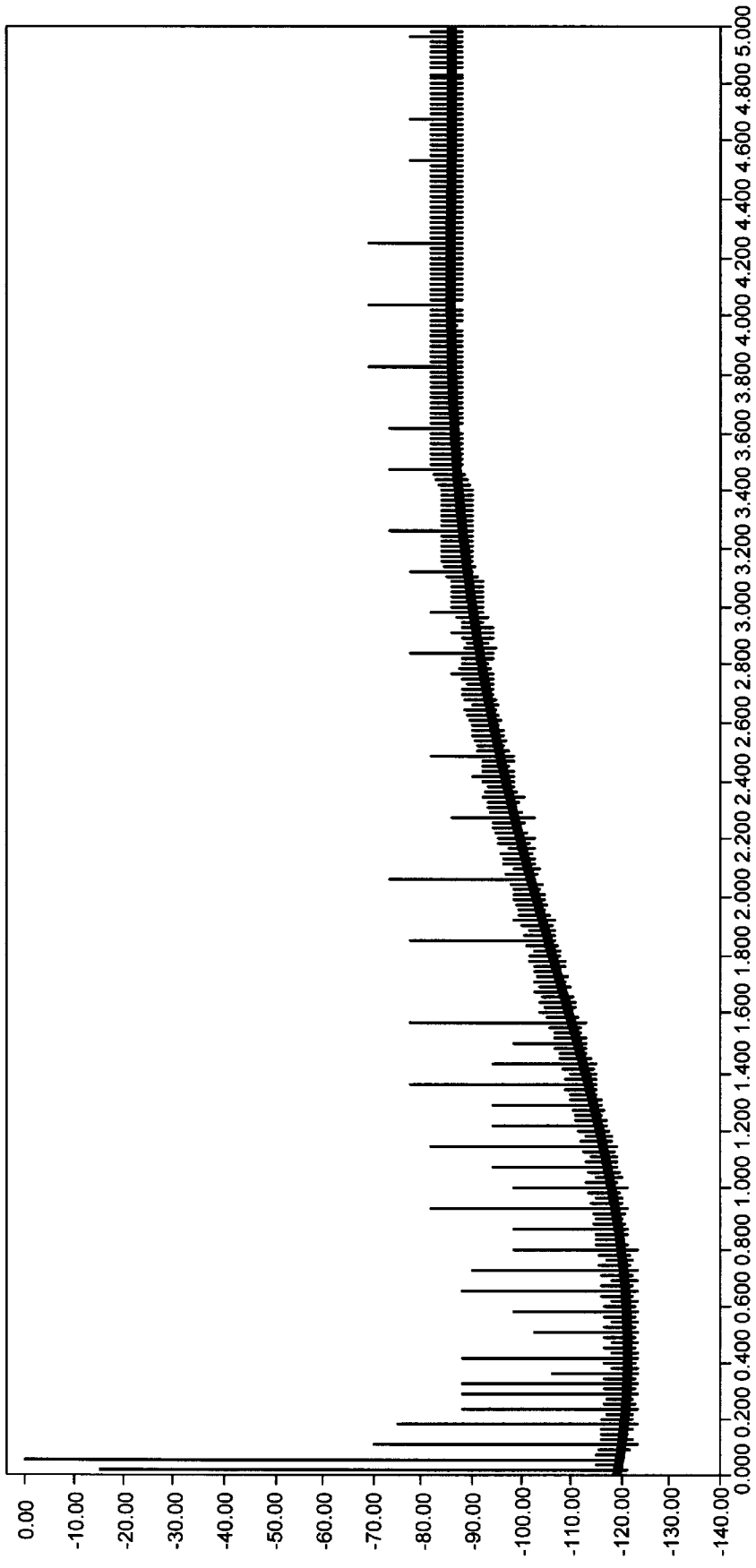
FIG. 6 illustrates the frequency spectrum from a multi-bit D/S converter which has linearity errors.

FIG. 6 represents a FFT performed on digital samples of a 50 kHz sine wave. The y-axis is in dB and the x-axis is in MHz. If the D/S modulator was ideal, FIG. 6 would only exhibit a spike at the frequency 50 kHz and at DC. However, because of the geometrical imperfections of the semiconductor devices which comprise the current generators contained within typical D/A converter, there are many spikes at the low frequency components in FIG. 6. These spikes represent the spectral content of the net linearity error of the D/S modulator in general, and the D/A converter 210 in particular.

In step 336 the method separates or extracts the net linearity error spectral content from the frequency domain representation of the digital sample set S. The net linearity error spectral content can be extracted in a plurality of ways. The operation of extracting the net linearity error spectral content in step 336 is described with respect to FIG. 15.

In step 338 an inverse frequency domain transform algorithm, preferably a FFT, is applied to the net linearity error spectrum. This produces a time domain signal, referred to as E, which represents the linearity error. It is noted that the signal E only originates from linearity errors and not from quantization error.

In order to save computational time, it is possible to decimate in the frequency domain before application of the inverse FFT in step 338 (or step 352). This is accomplished by simply removing bins in the upper spectrum (up to half sampling) that are zero, and removing mirrors of these bins.

In the preferred embodiment, steps 334, 336, and 338 are performed by the host computer 102 in software.

FIG. 14—Extracting the Specific Linearity Errors a(m) (Step 322 of FIG. 12)

FIG. 14 is a flowchart illustrating how the specific linearity error associated with each current generator of the D/A converter 210 is extracted from subsets s(m). From these specific linearity errors and the net linearity error E, correction coefficients can be designed and subsequently used to correct for linearity errors associated with each of the current generators. It is noted that the method performed in the flowchart of FIG. 14 is preferably identical to the method performed in the flowchart of FIG. 13, the only difference preferably being that the method performed in the flowchart of FIG. 13 is performed once on the recorded digital samples S to extract the net linearity error E, while the method performed in the flowchart of FIG. 14 is performed a plurality of times for each of the sorted subsets to extract the linearity errors a(m) for each subset.

With continuing reference to FIG. 10, in step 342 the method sets m=1. Thereafter, in step 344 a subset s(m) of digital samples is selected from memory.

In step 346 the method decimates the subset s(m), i.e. applies a low pass filter to the subset s(m). The decimation is performed to remove the high frequency components of the spectrum. The decimation operation in step 346 is preferably performed by the DSP 222, i.e., by the decimate block 230 implemented by DSP 222. Alternatively, a Hanning window may be applied to the subset s(m).

After the decimation performed in step 346, in step 348 a frequency domain transform, preferably an FFT, is applied to the selected subset. The resulting frequency domain representation of the subset s(m) contains linearity error information associated with a particular current generator in the D/A converter 210.

In step 350 the method extracts a specific linearity error spectrum from the frequency domain representation of the subset s(m). In the preferred embodiment, the linearity error information, or specific linearity spectrum error, is separated or extracted from the frequency domain representation of subset s(m) in substantially the same manner as the net linearity error spectrum was extracted from the frequency domain representation of set S of digital samples in step 336 of FIG. 13. Thus, in the preferred embodiment, the subsets s(m) are subjected to substantially the same linearity error extraction algorithm which was applied to the recorded digital samples S to obtain the net linearity error spectrum. The linearity error spectrum extraction algorithm performed in steps 336 and 350 is described with respect to FIG. 15.

After the extraction operation in step 350, the remaining spectral content represents the specific linearity error spectrum. Thereafter, in step 352 the method applies an inverse Fast Fourier Transform algorithm (FFT) to the specific linearity error spectrum. The resulting time domain values are referred to as specific linearity errors and designated as a(m).

After step 352, if m does not equal n-1 as determined in step 354, the method increments m in step 356 and returns to step 344. Thus, steps 344-352 are repeated for each individual subset s(m) of digital samples. In the preferred embodiment, steps 344-350 are repeated n-1 times, where n equals the number of current generators contained within the D/A converter 210.

In the preferred embodiment, step 346 is performed by the DSP 222, and steps 348, 350, and 352 are performed by the host computer 102 in software. In the preferred embodiment, where the DSP 222 performs step 346 and the host computer performs steps 348, 350, and 352, then step 346 is actually performed by the DSP 222 prior to step 342 for each of the subsets s(m). After step 346 is performed by the DSP 222 for each of the subsets s(m), then steps 348, 350, and 352 are performed by the host computer 102 for each of the decimated subsets.

FIG. 15—Extraction of Linearity Error Spectral Content

FIG. 15 shows the preferred procedure for extracting the linearity error spectral content. More particularly, FIG. 15 shows the linearity error spectrum extraction algorithm performed in steps 336 and 350.

As shown, in step 362 the D.C. components are removed or otherwise set to zero. In step 364 spectral components around the frequency of the inputted sine wave $f_{sw}$, are removed. The number of bins removed around the fundamental frequency depends on the accuracy of the frequency of the inputted sine wave and the applied window.

In step 366 spectral components are removed at the upper part of the spectrum containing quantization noise. In the preferred embodiment where decimation is performed in steps 332 and 346, then step 366 is optionally not performed, since this quantization noise has already been removed due to the decimation. If a Hanning window is applied in steps 332 and 346, then step 366 is preferably performed.

In step 368, mirrored spectral components around the half sampling are removed. This last removal is suggested since FFT spectrum of size N of a real signal contains unique information in half the spectrum. Above half sampling the information is redundant since bins (N/2+1) to (N-1) are mirrors to bins 1 to (N/2-1). If only the spectral content below the half sampling is eliminated, the bins will not be complex conjugated and thus the subsequent inverse FFT will result in a complex (as opposed to a real) time signal. The spectral content remaining after steps 362–368 represents the linearity error spectrum.

It is noted that steps 362–368 are preferably performed by the host computer 102.

FIG. 16—Generation of Linearity Error Correction Coefficients:

FIG. 16 is a flowchart showing how the linearity error correction coefficients c(m) are generated in step 304 of FIG. 11. With continuing reference to FIG. 10 and with further reference to FIG. 16, generation of the linearity error correction coefficients c(m) for m=1 to n-1, will now be explained. At first it should be noted that in the preferred embodiment, only n-1 linearity error correction coefficients need be calculated since one of the current generators (i.e., current generator n) contained within the D/A converter is presumed to be ideal, and the correction coefficient associated with this presumed ideal generator is set to zero. The remaining error correction coefficients are calculated with reference to the presumed ideal current generator.

In steps 372 and 374 respectively, the method initially sets each value of c(m) to 0, and sets m=0. Thereafter, in step 376, the method increments m by 1.

In step 378 a specific linearity error signal a(m) is then selected and multiplied by a value k(m) in order to minimize a power content of:

$$P = E - k(m)a(m),$$

where E is the net linearity error. The selection of the proper k(m) involves solving the above power equation for k(m)=-1, 0, and 1, and; the resulting power values are then used to calculate a and b in accordance with the following equations:

$$a = 0.5(P(1)+P(-1))-P(0), \text{ and}$$

$$b = 0.5(P(1)-P(-1)).$$

The value of k(m) which minimizes the power equation is then calculated by:

$$k(m) = -b/2a.$$

Once a suitable value of k(m) has been identified, in step 380 the method replaces the current value of the net linearity error E with what it was before less k(m)a(m). In other words, in step 380 the method calculates:

$$E = E - k(m)a(m)$$

In step 382 the method replaces the current value of c(m) with the calculated value c(m) plus k(m), i.e., c(m)=c(m)+k(m).

Steps 376 through 382 are repeated for each value of m from 1 to n-1, where n equals the number of current generators within the D/A converter 210. This is accomplished by decision block 384.

In step 386 the method determines whether the current value of E is sufficiently reduced. If E is sufficiently reduced, the process ends. Normally, E has not been sufficiently reduced after a first iteration of steps 374–384. Steps 374–384 are repeated until E has been sufficiently reduced. FIGS. 18–23 show the power content of E after successive iterations of steps 144–156. As can be seen, the power content reduces with each iteration. It has been found that the iteration defined by steps 374–384 should be generally repeated four to five times in order to sufficiently reduce E.

It is noted that steps 372–386 are preferably performed by the host computer 102.

In FIG. 16, calculation of the correction coefficients c(m) is performed in the time domain. In other words, in FIG. 16 the correction coefficients are calculated after an inverse frequency domain transformation has been applied to the net and specific linearity spectral contents, in steps 338 of FIG. 13 and 352 of FIG. 14, respectively, to generate the time domain equivalents E and a(m). The correction coefficients were then calculated using E and a(m). The calculation involved minimizing the power content of E at steps 378 and 386. It is to be understood, however, the present invention is not to be limited thereto.

The present invention also contemplates generating the correction coefficients from the net and specific linearity error spectral contents, without transformations of these spectral contents into the time domain. In other words, the present invention contemplates generating the correction coefficients from the net and specific linearity error spectral contents directly after steps 336 and 350, respectively. For example the error correction coefficients c(m) can be calculated by iteratively minimizing the spectral content between the net linearity error spectral content and the specific linearity error spectral contents. This alternative embodiment is advantageous in that there is no need to perform an inverse frequency domain transformation after the extraction steps 336 and 350 described in FIGS. 13 and 14.

In the currently preferred embodiment of the invention, the linearity error correction coefficients c(m) are generated in the following manner. In the currently preferred embodiment, the coefficients c(m) are generated by computing the matrix equation:

$$c = (A^T A)^{-}(A^T E)$$

where c is a column vector with entries comprising the correction coefficients c(m), A is a matrix with columns comprising the specific linearity subsets a(m), and E is the column vector of net linearity error. If there are S samples after decimation and n current generators, vector c has n-1 elements, matrix A has S rows and n-1 columns, and vector E has S elements. The particular linear combination of a(m) that most closely equals E, in the least square sense, is given by the coefficient vector c as defined in the above matrix equation.

The above matrix equation is preferably computed by the host computer 102. This calculation produces the coefficients c(m) with reduced computation requirements. Also, this matrix calculation produces coefficients c(m) with greater accuracy. Thus, this matrix calculation method is preferred over the method shown in FIG. 16.

It is noted that the coefficients c(m) can be generated from the above matrix equation where A is a 2 dimensional matrix comprising specific linearity error spectrums a(m), and E is the net linearity error spectrum. In other words, the above equation can be calculated in the frequency domain as well as the time domain.

L/E Correction Circuit Configuration

With the error correction coefficients c(m) fully calculated, the method next configures the L/E correction circuit 224 in step 306 to model the linearity error transfer B of the D/A converter 210. In the preferred embodiment, the digital error correction circuit 224 is defined by an EEPROM or other programmable memory 212 configured as a look-up table (LUT). In the following discussion, the term "y" refers to an output value of the D/S modulator, which is also an input to the LUT or linearity error correction circuit 224, as implemented by DSP 222 in the preferred embodiment Also, the term "o(y)" refers to an output value of the LUT or linearity error correction circuit 224. Thus, entries or output values o(y) of the look-up table are calculated for each uncorrected digital input signal y.

It is to be noted that each input value y to the LUT is also an input to the internal D/A converter 210. Thus, each input value y is associated with a particular set of internal D/A converter current generators being active or on. In other words, for each output y of the D/S modulator, which is an input to the LUT, this value y is associated with a particular set of internal D/A converter current generators being active or on.

Further, each c(m) is associated with a particular internal D/A converter current generator. The value 0 is associated with the current generator which is presumed to be ideal. Thus the value 0 essentially serves as one of the coefficients c(m) for the respective current generator which is presumed to be ideal. In the preferred embodiment, each output value o(y) is a summation of the input value y and the c(m) values corresponding to those current generators of the internal D/A which are active for that input value y. The entries or output values o(y) are digital values with reduced linearity errors, which correspond to or map to uncorrected digital values y outputted by the D/S modulator. The LUT comprised in the digital error correction circuit 224 is addressable by the digital values y output by the particular D/S modulator. Once properly configured, any digital representation of an analog signal $V_{in}$ inputted into the D/S modulator is corrected or enhanced by the L/E correction circuit 224. Thus the digital output of the D/S modulator is received by the L/E correction circuit 224. The L/E correction circuit 224 uses the received value to index into the LUT to obtain the corrected value with reduced linearity error. Thus, the L/E correction circuit 224 automatically corrects for linearity errors in the digital output of the D/S modulator.

Dynamic Re-calibration

As stated above, the current generators contained within the internal D/A converter 210 may vary with time and temperature. Accordingly, the linearity error associated thereto may likewise vary over time and temperature. Thus, in the preferred embodiment the L/E circuit 224 is recalibrated over time and use, in order to account for changing linearity errors. In other words, the L/E circuit 224 is dynamically recalibrated during use. To recalibrate, the above method is performed, and the host computer 102 generates a new set of correction coefficients c(m) and reconfigures the L/E correction circuit 224 in accordance thereto. In this manner, the resolution of the D/S converter can be maximized throughout its use.

Figure 24:
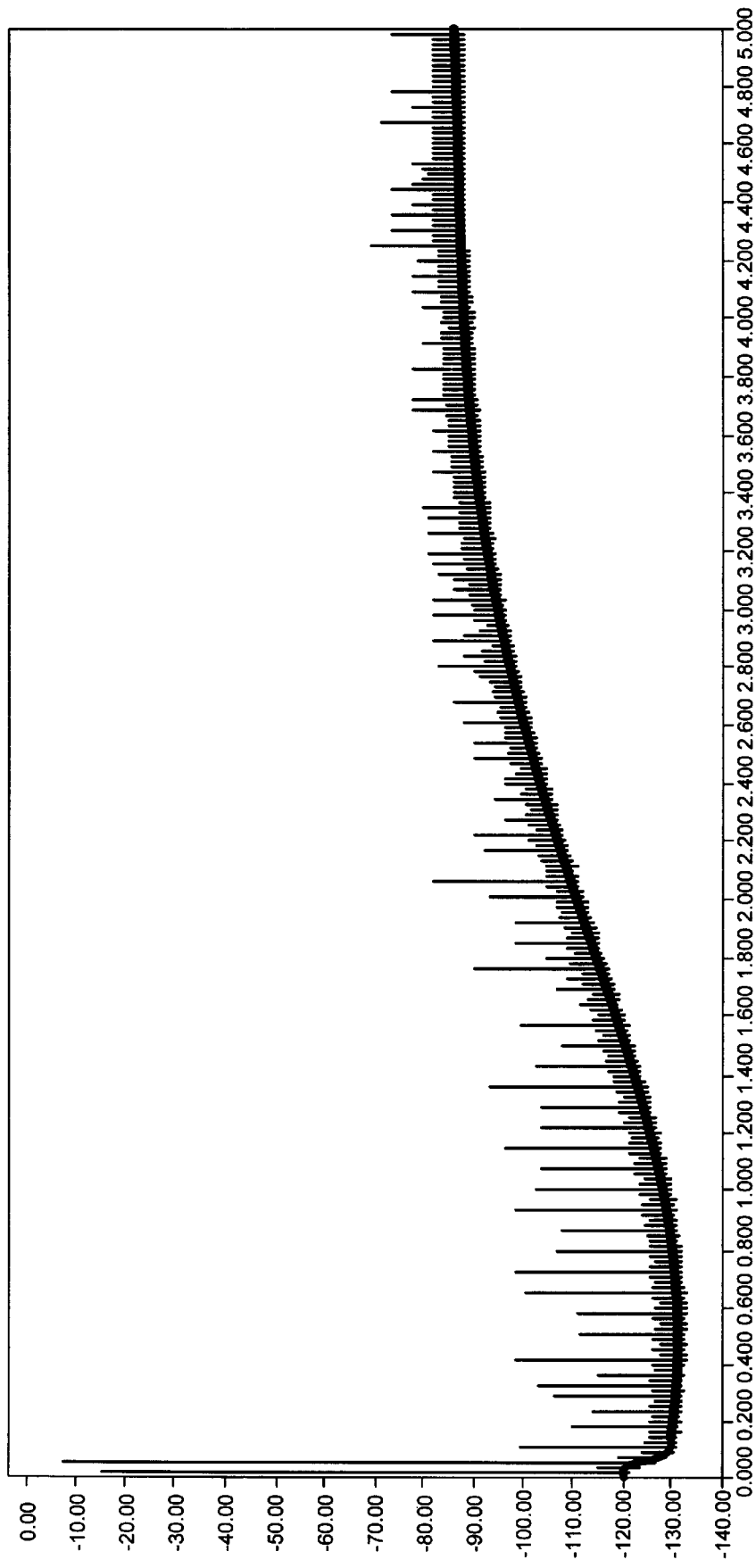
FIG. 24 illustrates a FFT of sine wave digital samples after linearization in accordance with the present invention.

FIG. 24—FFT of Linearized Digital samples

FIG. 24 shows a FFT of linearized digital samples of a 50 kHz sine wave. When compared to FIG. 6, which represents a FFT of the same sine wave without linearization, it can be seen that errors, i.e., the spikes outside of DC and 50 kHz and in the lower frequencies, are reduced significantly (residual errors are probably caused by errors in the sine wave, dynamic errors and errors in various preceding analog stages). This higher precision can be achieved without having to implement expensive, highly precise current generators within the internal D/A converter. In simulations using the present invention, it has been found that the output resolution of the D/S converter 80 can be increased to 18 bits operating at 1 MHz. In the simulations, the resampling rate $f_s$ was 100 MHz.

Numerous variations and modifications will become apparent to those skilled in the art once the above disclosure is fully appreciated. It is intended that the following claims be interpreted to embrace all such variations and modifications.

What is claimed is:

1. A method for constructing a linearity error correction device for use in an analog to digital (A/D) converter, the method comprising:

applying an analog waveform to the A/D converter, wherein the A/D converter generates output digital signals representative thereof;

recording a plurality of the output digital signals;

generating linearity error information from the recorded plurality of output digital signals;

calculating linearity error correction coefficients c(m) in response to the linearity error information; and constructing the linearity error correction device using said linearity error correction coefficients c(m);

wherein the linearity error correction device is useable to correct linearity errors in the A/D converter.

2. The method of claim 1, wherein said constructing the linearity error correction device comprises:

generating a plurality of first digital values from the linearity error correction coefficients c(m);

constructing said linearity error correction device using said plurality of first digital values.

3. The method of claim 2, wherein said constructing said linearity error correction device comprises configuring a look-up table including said plurality of first digital values;

wherein said plurality of first digital values are addressable by an output of the A/D converter.

4. The method of claim 3, wherein the A/D converter is operable to convert an input analog signal into an output digital value, wherein the output digital value includes linearity errors;

wherein the linearity error correction device is operable to translate the output digital value into one of said plurality of first digital values, where said one of said plurality of first digital values has reduced linearity errors when compared to the linearity errors in the output digital value.

5. The method of claim 1, wherein the A/D converter includes a D/A converter, wherein said D/A converter includes a plurality of current generators, wherein one or more of said current generators produces linearity errors in the A/D converter, wherein each of said linearity error correction coefficients c(m) corresponds to a particular active state of a generator internal to the D/A converter in the A/D converter.

6. The method of claim 5, wherein said constructing the linearity error correction device comprises:

generating a plurality of first digital values from the linearity error correction coefficients c(m);

constructing said linearity error correction device using said plurality of first digital values.

7. The method of claim 6, wherein the plurality of first digital values are generated as a function of said error correction coefficients c(m) for each value of m from 1 to n, wherein n represents a number of current generators contained within the D/A converter of the A/D converter

21 wherein said generating linearity error information includes:

sorting the recorded plurality of output digital signals into subsets of output digital signals, each sub-set corresponding to a particular active state of a generator internal to the D/A converter in the A/D converter;

generating specific linearity errors a(m) from the sub-sets of output digital signals;

wherein said linearity error correction coefficients c(m) are calculated as a function of the specific linearity errors a(m).

8. The method of claim 7, wherein said generating specific linearity errors a(m) comprises:

applying a frequency domain transform to the sub-sets of output digital signals to generate a frequency domain equivalent thereof;

extracting specific linearity error spectrums from the frequency domain representations of the sub-sets of output digital signals;

generating the specific linearity errors a(m) by applying an inverse frequency domain transform to the specific linearity error spectrums.

9. The method of claim 8, wherein the extracting the specific linearity error spectrums comprises performing two or more of the following:

removing spectral content at zero frequency from the frequency domain representations of the sub-sets of output digital signals;

removing spectral content at a frequency of the analog waveform from the frequency domain representations of the sub-sets of output digital signals; and removing spectral content from a range of frequencies containing quantization noise from the frequency domain representations of the sub-sets of output digital signals.

10. The method of claim 7, wherein said generating linearity error information further comprises:

generating a net linearity error E from the recorded plurality of output digital signals;

wherein said linearity error correction coefficients c(m) are calculated as a function of the specific linearity errors a(m) and said net linearity error E.

11. The method of claim 10, wherein said generating the net linearity error E comprises:

applying a frequency domain transform to the recorded plurality of output digital signals to generate a frequency domain representation thereof;

extracting a net linearity error spectrum from the frequency domain representation of the recorded plurality of output digital signals;

applying an inverse frequency domain transform algorithm to the net linearity error spectrum to generate the net linearity error E.

12. The method of claim 11, wherein the extracting the net linearity error spectrum comprises performing two or more of the following:

removing spectral content at zero frequency from the frequency domain representations of the recorded plurality of output digital signals;

removing spectral content at a frequency of the analog waveform from the frequency domain representations of the recorded plurality of output digital signals;

removing spectral content from a range of frequencies containing quantization noise from the frequency

22 domain representations of the recorded plurality of output digital signals.

13. The method of claim 10, wherein calculating the correction coefficients c(m) comprises iteratively minimizing a power content between said net linearity error E and said specific linearity errors a(m) to produce said coefficients c(m).

14. The method of claim 13, wherein calculating the correction coefficients c(m) comprises:

a) setting c(m) to zero for each value of m from one to n−1;

b) setting m to zero;

c) adding one to m;

d) calculating k(m) which minimizes a power content of;

e) subtracting k(m)a(m) from E;

f) adding k(m) to c(m);

g) repeating steps c) through f) in sequence until m is greater than n−1;

h) repeating steps b) through g) until E is substantially low.

15. The method of claim 6, wherein the plurality of first digital values are generated as a function of said error correction coefficients c(m) for each value of m from 1 to n, wherein n represents a number of current generators contained within the D/A converter of the A/D converter;

wherein said generating linearity error information comprises:

sorting the recorded plurality of output digital signals into subsets of output digital signals, each sub-set corresponding to a particular active state of a generator internal to the D/A converter in the A/D converter, generating specific linearity error spectrums from the sub-sets of output digital signals;

wherein said linearity error correction coefficients c(m) are calculated as a function of the specific linearity error spectrums.

16. The method of claim 15, wherein said generating the specific linearity error spectrums comprises:

applying a frequency domain transform algorithm to the sub-sets of output digital signals to generate a frequency domain equivalent thereof;

extracting the specific linearity error spectrums from the frequency domain representations of the sub-sets of output digital signals.

17. The method of claim 16, wherein the extracting the specific linearity error spectrums comprises performing two or more of the following:

removing spectral content at zero frequency from the frequency domain representations of the sub-sets of digital signals;

removing spectral content at a frequency of the analog waveform from the frequency domain representations of the sub-sets of output digital signals; and removing spectral content from a range of frequencies containing quantization noise from the frequency domain representations of the sub-sets of output digital signals.

18. The method of claim 15, wherein said generating linearity error information further comprises:

generating a net linearity error spectrum from the plurality of output digital signals;

wherein said linearity error correction coefficients c(m) are calculated as a function of the specific linearity error spectrums and said net linearity error spectrum.

19. The method of claim 18, wherein said generating the net linearity error spectrum comprises:

applying a frequency domain transform algorithm to the plurality of output digital signals to generate a frequency domain representation thereof;

extracting the net linearity error spectrum from the frequency domain representation of the plurality of output digital signals.

20. The method of claim 19, wherein the extracting the net linearity error spectrum comprises performing two or more of the following:

removing spectral content at zero frequency from the frequency domain representations of the plurality of output digital signals;

removing spectral content at a frequency of the analog waveform from the frequency domain representations of the plurality of output digital signals;

removing spectral content from a range of frequencies containing quantization noise from the frequency domain representations of the plurality of output digital signals.

21. The method of claim 18, wherein calculating the correction coefficients c(m) comprises iteratively minimizing a spectral content between said net linearity error spectrum and said specific linearity error spectrums to produce said coefficients c(m).

22. The method of claim 1, wherein the A/D converter is operable to convert an input analog signal into one or more output digital values, wherein each of the output digital values includes linearity errors;

wherein the A/D converter includes a D/A converter, wherein said D/A converter includes a plurality of current generators, wherein one or more of said current generators produces the linearity errors in the A/D converter, wherein each of said linearity error correction coefficients c(m) corresponds to a particular active state of a generator internal to the D/A converter in the A/D converter;

wherein said constructing the linearity error correction device comprises:

generating a plurality of first digital values from the linearity error correction coefficients c(m); and constructing said linearity error correction device using said plurality of first digital values;

wherein the A/D converter includes a plurality of possible code outputs, wherein a first digital value is constructed for each of said plurality of possible code outputs, wherein, for a respective code output, a respective first digital value is constructed by summing a corresponding output digital value from the A/D converter and one or more of said correction coefficients c(m) which corresponds to a generator internal to the D/A converter which was active in producing the corresponding output digital value.

23. A system for generating a linearity error correction device for use in an A/D converter, the system comprising:

an analog waveform generator selectively connected to the A/D converter for providing an analog waveform to the A/D converter, wherein the A/D converter generates output digital signals representative of the analog waveform generated by the analog waveform generator when the analog waveform generator is connected to the A/D converter;

a first memory connected to the A/D converter for storing the plurality of output digital signals representative of the analog waveform digital signals outputted by the A/D converter; and a computer system, coupled to the first memory and to the linearity error correction device, for calculating a plurality of first digital signals from the plurality of output digital signals, wherein the computer is operable to generate linearity error information from the plurality of the output digital signals, calculate linearity error correction coefficients c(m) as a function of the linearity error information, and generate the plurality of first digital signals from the linearity error correction coefficients c(m);

wherein the plurality of first digital signals are useable in configuring the linearity error correction device.

24. The system of claim 23, wherein the A/D converter includes a D/A converter, wherein said D/A converter includes a plurality of current generators, wherein one or more of said current generators produces linearity errors in the A/D converter, wherein each of said linearity error correction coefficients c(m) corresponds to a particular active state of a generator internal to the D/A converter in the A/D converter.

25. The system of claim 24, wherein the plurality of first digital signals are generated as a function of said error correction coefficients c(m) for each value of m from 1 to n, wherein n represents the number of current generators comprised in the D/A converter;

wherein, in generating said linearity error information, the computer is operable to sort the plurality of output digital signals into sub-sets of output digital signals, each sub-set corresponding to a particular active state of a generator internal to the D/A converter in the A/D converter, wherein the computer generates specific linearity errors a(m) from the sub-sets of output digital signals;

wherein said linearity error correction coefficients c(m) are calculated as a function of the specific linearity errors a(m).

26. The system of claim 24, wherein the plurality of first digital signals are generated as a function of said error correction coefficients c(m) for each value of m from 1 to n, wherein n represents the number of current generators comprised in the D/A converter;

wherein, in generating said linearity error information, the computer is operable to sort the plurality of output digital signals into subsets of output digital signals, each sub-set corresponding to a particular active state of a generator internal to the D/A converter in the A/D converter, wherein the computer generates specific linearity error spectrums from the sub-sets of output digital signals;

wherein said linearity error correction coefficients c(m) are calculated as a function of the specific linearity error spectrums.

27. A memory media which stores program instructions for constructing a linearity error correction device for use in an A/D converter, wherein the program instructions implement:

receiving a recorded plurality of output digital signals generated by the A/D converter, wherein the recorded plurality of output digital signals were generated in response to an analog waveform applied to the A/D converter;

generating linearity error information from the recorded plurality of output digital signals;

calculating linearity error correction coefficients c(m) in response to the linearity error information; and constructing the linearity error correction device using said linearity error correction coefficients c(m).

28. The memory media of claim 27, wherein said constructing the linearity error correction device comprises:
generating a plurality of first digital values from the linearity error correction coefficients c(m);
constructing said linearity error correction device using said plurality of first digital values.

29. The memory media of claim 28, wherein said constructing said linearity error correction device comprises configuring a look-up table including said plurality of first digital values;
wherein said plurality of first digital values are addressable by an output of the A/D converter.

30. The memory media of claim 27, wherein the A/D converter includes a D/A converter, wherein said D/A converter includes a plurality of current generators, wherein one or more of said current generators produces linearity errors in the A/D converter, wherein each of said linearity error correction coefficients c(m) corresponds to a particular active state of a generator internal to the D/A converter in the A/D converter.

31. The memory media of claim 30, wherein said constructing the linearity error correction device comprises:
generating a plurality of first digital values from the linearity error correction coefficients c(m);
constructing said linearity error correction device using said plurality of first digital values.

32. The memory media of claim 31, wherein the plurality of first digital values are generated as a function of said error correction coefficients c(m) for each value of m from 1 to n, wherein n represents a number of current generators contained within the D/A converter of the A/D converter
wherein said generating linearity error information includes:
sorting the recorded plurality of output digital signals into subsets of output digital signals, each sub-set corresponding to a particular active state of a generator internal to the D/A converter in the A/D converter;
generating specific linearity errors a(m) from the sub-sets of output digital signals;
wherein said linearity error correction coefficients c(m) are calculated as a function of the specific linearity errors a(m).

33. The memory media of claim 32, wherein said generating linearity error information further comprises:
generating a net linearity error E from the recorded plurality of output digital signals;
wherein said linearity error correction coefficients c(m) are calculated as a function of the specific linearity errors a(m) and said net linearity error E.

34. A method of constructing a linearity error correction device for use in an A/D converter, wherein the A/D converter includes a modulator, wherein the modulator includes a D/A converter, the method comprising:
applying an analog waveform to the modulator, wherein the modulator generates digital signals representative thereof;
recording a plurality of the digital signals;
applying a frequency domain transform to the plurality of digital signals to generate a frequency domain representation thereof;
extracting a net linearity error spectrum from the frequency domain representation of the plurality of digital signals;

applying an inverse frequency domain transform to the net linearity error spectrum to generate a net linearity error E;
sorting the plurality of digital signals into sub-sets, each digital signal in a particular sub-set corresponding to a particular active state of a generator internal to the D/A converter in the modulator;
applying a frequency domain transform to each of the sub-sets of digital signals to generate a frequency domain representation thereof;
extracting a specific linearity error spectrum from each of the frequency domain representations of the sub-sets of digital signals;
generating specific linearity errors a(m) by applying an inverse frequency domain transform to each of the specific linearity error spectrums;
calculating linearity error correction coefficients c(m) as a function of E and a(m):
constructing said linearity error correction device using the calculated linearity error correction coefficients c(m), wherein said linearity error correction device is operable to correct linearity errors in the modulator.

35. The method of claim 34, further comprising:
applying a window to the plurality of digital signals after said recording the plurality of the digital signals and prior to said applying a frequency domain transform to the plurality of digital signals to prevent spectral leakage of noise from high frequencies to low frequencies; and
applying a window to each of the plurality of sub-sets of digital signals after said sorting and prior to said applying a frequency domain transform to each of the sub-sets of digital signals.

36. The method of claim 34, wherein the extracting the specific linearity error spectrum from each of the frequency domain representative of the sub-sets of digital signals further comprises two or more of the following:
removing a spectral content at zero frequency from each frequency domain representation of the sub-sets of digital signals;
removing a spectral content at a frequency of the analog waveform from each frequency domain representation of the sub-sets of digital signals;
removing a spectral content containing quantization noise from each frequency domain representation of the sub-sets of digital signals.

37. The method of claim 34, wherein the extracting the net linearity error spectrum from the frequency domain representative of the plurality of digital signals further comprises:
removing a spectral content at zero frequency from the frequency domain representation of the plurality of digital signals;
removing a spectral content at a frequency of the analog waveform from the frequency domain representation of the plurality of digital signals, and;
removing a spectral content containing quantization noise from the frequency domain representation of the plurality of digital signals.

38. The method of claim 34, wherein said calculating the linearity error correction coefficients c(m) comprises iteratively minimizing a power content between said net linearity error E and said specific linearity errors a(m) to produce said coefficients c(m).

39. The method of claim 38, wherein said calculating the linearity error correction coefficients c(m) comprises:

a) setting c(m) to zero for each value of m from one to n−1;
b) setting m to zero;
c) adding one to m;
d) calculating k(m) which minimizes a power content of;
e) subtracting k(m)a(m) from E;
f) adding k(m) to c(m);
g) repeating steps c) through f) in sequence until m is greater than n−1;
h) repeating steps b) through g) until E is substantially low.

40. The method of claim 34, wherein the D/A converter in the modulator produces linearity errors in the modulator, wherein the method constructs the linearity error correction device to correct said linearity errors produced by the D/A converter in the modulator.

41. The method of claim 40, wherein the A/D converter is a multi-bit A/D converter, wherein the D/A converter in the A/D modulator includes a plurality of current generators, wherein one or more of said current generators produces linearity errors in the A/D converter, wherein the method constructs the linearity error correction device to correct said linearity errors produced by said one or more current generators.

42. The method of claim 41, wherein n represents a number of current generators comprised within the D/A converter of the modulator.

43. The method of claim 34, wherein the applied frequency domain transform comprises a Fast Fourier Transform algorithm, and wherein the applied the inverse frequency domain transform comprises an inverse Fast Fourier Transform algorithm.

44. A method of constructing a linearity error correction device for use in an A/D converter, wherein the A/D converter includes a modulator, wherein the modulator includes a D/A converter, the method comprising:

applying an analog waveform to the modulator, wherein the modulator generates digital signals representative thereof;

recording a plurality of the digital signals;

applying a frequency domain transform to the plurality of digital signals to generate a frequency domain representation thereof;

generating a net linearity error spectrum from the frequency domain representation of the plurality of digital signals;

sorting the plurality of digital signals into sub-sets, each digital signal in a particular sub-set corresponding to a particular active state of a generator internal to the D/A converter in the modulator;

applying a frequency domain transform algorithm to the sub-sets of digital signals to generate frequency domain equivalents thereof;

generating specific linearity error spectrums from the frequency domain representations of the sub-sets of digital signals;

calculating linearity error correction coefficients as a function of the net linearity error spectrum and the specific linearity spectrums;

constructing said linearity error correction device using the calculated linearity error correction coefficients, wherein said linearity error correction device is operable to correct linearity errors in the modulator.

45. The method of claim 44, wherein generating net linearity spectrum comprises performing two or more of the following:

removing a spectral content at zero frequency from the frequency domain representation of the plurality of digital signals;

removing a spectral content at a frequency of the analog waveform from the frequency domain representation of the plurality of digital signals, and;

removing a spectral content containing quantization noise from the frequency domain representation of the plurality of digital signals.

46. The method of claim 44, wherein generating the specific linearity spectrums comprises performing two or more of the following:

removing a spectral content at zero frequency from each frequency domain representation of the sub-sets of digital signals;

removing a spectral content at a frequency of the analog waveform from each frequency domain representation of the sub-sets of digital signals;

removing a spectral content containing quantization noise from each frequency domain representation of the sub-sets of digital signals.

47. The method of claim 44, wherein calculating the linearity error correction coefficients includes iteratively minimizing spectral content between said net linearity error spectrum and said specific linearity error spectrums to produce said coefficients.

48. The method of claim 45, wherein said calculating the linearity correction coefficients comprises:

a) initially setting the correction coefficients to zero;
b) selecting one of the correction coefficients;
c) calculating a weighting value which when multiplied by one of the specific linearity error spectrums, produces a weighted specific linearity error spectrum, wherein the weighted specific linearity error spectrum minimizes the net linearity error spectrum when the weighted specific linearity error spectrum is subtracted therefrom;
d) subtracting the weighted specific linearity error spectrum from the net linearity error spectrum;
e) adding the weighting value to the selected correction coefficient.

49. A method of constructing a linearity error correction device for use in an A/D converter, wherein the A/D converter includes a modulator, wherein the modulator includes a D/A converter, the method comprising:

applying an analog waveform to the modulator, wherein the modulator generates digital signals representative thereof;

recording a plurality of the digital signals;

generating a net linearity error signal from the plurality of digital signals;

sorting the plurality of digital signals into sub-sets, each digital signal in a particular sub-set corresponding to a particular active state of a generator internal to the D/A converter in the modulator;

generating specific linearity error signals from the sub-sets of digital signals;

calculating linearity error correction coefficients as a function of the net linearity error signal and the specific linearity error signals; and constructing said linearity error correction device using the calculated linearity error correction coefficients, wherein said linearity error correction device is operable to correct linearity errors in the modulator.

50. A method of constructing a linearity error correction device, the method comprising the steps of:

applying an analog waveform to a modulator of an A/D converter, wherein the modulator generates digital signals representative thereof;

recording a plurality of the digital signals;

generating linearity error information from the plurality of the digital signals;

calculating linearity error correction coefficients c(m) as a function of the linearity error information;

constructing said linearity error correction device using the calculated linearity error correction coefficients.

51. The method of claim 50, wherein said generating linearity error information comprises:

generating a net linearity error E from the plurality of digital signals;

sorting the plurality of digital signals into sub-sets, each digital signal in a particular sub-set corresponding to a particular active state of a generator internal to the D/A converter in the modulator; and generating specific linearity errors a(m) from the sub-sets of digital signals;

wherein said linearity error corrections coefficients c(m) are calculated as a function of the net linearity error E and the specific linearity errors a(m).

52. The method of claim 51, wherein said generating the net linearity error E comprises:

applying a frequency domain transform algorithm to the plurality of digital signals to generate a frequency domain representation thereof;

extracting a net linearity error spectrum from the frequency domain representation of the plurality of digital signals;

applying an inverse frequency domain transform algorithm to the net linearity error spectrum to generate the net linearity error E.

53. The method of claim 52, wherein generating the specific linearity errors a(m) comprises:

applying a frequency domain transform algorithm to the sub-sets of digital signals to generate a frequency domain equivalent thereof;

extracting specific linearity error spectrums from the frequency domain representations of the sub-sets of digital signals;

generating specific linearity errors a(m) by applying an inverse frequency domain transform algorithm to the specific linearity error spectrums.

54. The method of claim 53, further comprising applying a window to the plurality of digital signals to prevent spectral leakage of noise from high frequencies to low frequencies.

55. The method of claim 53, wherein the extracting net and specific linearity error spectrums further comprises two or more of the following:

removing spectral content at zero frequency from the frequency domain representations of the plurality of digital signals and the sub-sets of digital signals;

removing spectral content at a frequency of the analog waveform from the frequency domain representations of the plurality of digital signals and the sub-sets of digital signals;

removing spectral content from a range of frequencies containing quantization noise from the frequency domain representations of the plurality of digital signals and the sub-sets of digital signals.

56. The method of claim 51, wherein said calculating the linearity error correction coefficients c(m) comprises iteratively minimizing a power content between said net linearity error E and said specific linearity errors a(m) to produce said coefficients c(m).

57. The method of claim 56, wherein said calculating the correction coefficients c(m) comprises:

a) setting c(m) to zero for each value of m from one to n−1;

b) setting m to zero;

c) adding one to m;

d) calculating k(m) which minimizes a power content of;

e) subtracting k(m)a(m) from E;

f) adding k(m) to c(m);

g) repeating steps c) through f) in sequence until m is greater than n−1;

h) repeating steps b) through g) until E is substantially low.

58. The method of claim 57, wherein n represents a number of current generators contained within an internal D/A converter of the modulator.

59. An apparatus for calibrating a linearity error reduction device, the apparatus comprising:

an analog waveform generator connectable to an input of a modulator, wherein the modulator comprises a portion of an A/D converter, wherein the modulator generates digital signals representative of an analog waveform when the modulator is connected to the analog waveform generator;

a first memory for storing a plurality of digital signals representative of the analog waveform; and a general purpose computer in data communication with the first memory and connectable to the modulator, for calibrating the linearity error correction device as a function of the plurality of digital signals, wherein the general purpose computer includes:

a linearity error signal generator, for generating linearity error signals as a function of the plurality of digital signals;

a linearity error coefficient generator, for deriving linearity error coefficients as a function of the linearity error signals; and a calibration device for calibrating the linearity error reduction device as a function of the linearity error coefficients.

60. The apparatus of claim 59, further including a second memory for storing the plurality of digital signals sorted into subsets, wherein each digital signal in a particular sub-set corresponds to a particular active state of a generator internal to the D/A converter in the modulator, and wherein the linearity error signal generator generates (1) a net linearity error signal as a function of the plurality of digital signals, (2) specific linearity error signals as a function of the subsets of the plurality of digital signals.

61. The apparatus of claim 60, wherein the wherein the linearity error signal generator further includes:

a frequency domain transformer for (1) transforming the plurality of digital signals into a frequency domain representation thereof, and (2) transforming the subsets of digital signals into frequency domain representations thereof;

an error spectrum extractor for extracting (1) a net linearity error spectrum from the frequency domain representation of the plurality of digital signals, and (2) specific linearity error spectrums from the frequency domain representations of the subsets of digital signals, and;

an inverse frequency domain transformer for (1) inverse transforming the net linearity error spectrum into the net linearity signal, and (2) inverse transforming the specific linearity error spectrums into the specific linearity signals.

62. The apparatus of claim 61, wherein the error spectrum extractor removes spectral content from the net linearity spectrum and the specific linearity spectrums at (1) zero frequency, (2) a frequency of the analog waveform, and (3) a range of frequencies containing quantization noise.

63. The apparatus of claim 59, wherein the analog waveform generator comprises a sinewave generator.

64. A method for constructing a linearity error correction device for use in an analog to digital (A/D) converter, the method comprising:
    recording a plurality of output digital signals from the A/D converter;
    generating linearity error information from the recorded plurality of output digital signals;
    calculating linearity error correction coefficients $c(m)$ in response to the linearity error information; and
    constructing the linearity error correction device using said linearity error correction coefficients $c(m)$;
    wherein the linearity error correction device is useable to correct linearity errors in the A/D converter.

65. The method of claim 64, wherein said constructing the linearity error correction device comprises:
    generating a plurality of first digital values from the linearity error correction coefficients $c(m)$;
    constructing said linearity error correction device using said plurality of first digital values.

66. The method of claim 65, wherein said constructing said linearity error correction device comprises configuring a look-up table including said plurality of first digital values;
    wherein said plurality of first digital values are addressable by an output of the A/D converter.

67. The method of claim 66, wherein the A/D converter is operable to convert an input analog signal into an output digital value, wherein the output digital value includes linearity errors;
    wherein the linearity error correction device is operable to translate the output digital value into one of said plurality of first digital values, where said one of said plurality of first digital values has reduced linearity errors when compared to the linearity errors in the output digital value.

68. The method of claim 64, wherein the A/D converter includes an internal D/A converter, wherein said internal D/A converter includes a plurality of current generators, wherein one or more of said current generators produces linearity errors in the A/D converter, wherein each of said linearity error correction coefficients $c(m)$ corresponds to a particular active state of a generator internal to the internal D/A converter in the A/D converter.

69. The method of claim 68, wherein said constructing the linearity error correction device comprises:
    generating a plurality of first digital values from the linearity error correction coefficients $c(m)$;
    constructing said linearity error correction device using said plurality of first digital values.

70. The method of claim 69, wherein the plurality of first digital values are generated as a function of said error correction coefficients $c(m)$ for each value of m from 1 to n, wherein n represents a number of current generators contained within the internal D/A converter of the A/D converter wherein said generating linearity error information includes:
    sorting the recorded plurality of output digital signals into subsets of output digital signals, each sub-set corresponding to a particular active state of a generator internal to the internal D/A converter in the A/D converter;
    generating specific linearity errors $a(m)$ from the subsets of output digital signals;
wherein said linearity error correction coefficients $c(m)$ are calculated as a function of the specific linearity errors $a(m)$.

71. The method of claim 70, wherein said generating specific linearity errors $a(m)$ comprises:
    applying a frequency domain transform to the sub-sets of output digital signals to generate a frequency domain equivalent thereof;
    extracting specific linearity error spectrums from the frequency domain representations of the sub-sets of output digital signals;
    generating the specific linearity errors $a(m)$ by applying an inverse frequency domain transform to the specific linearity error spectrum.

72. The method of claim 71, wherein the extracting the specific linearity error spectrums comprises performing two or more of the following:
    removing spectral content at zero frequency from the frequency domain representations of the sub-sets of output digital signals;
    removing spectral content at a frequency of the analog waveform from the frequency domain representations of the sub-sets of output digital signals; and
    removing spectral content from a range of frequencies containing quantization noise from the frequency domain representations of the sub-sets of output digital signals.

73. The method of claim 70, wherein said generating linearity error information further comprises:
    generating a net linearity error E from the recorded plurality of output digital signals;
    wherein said linearity error correction coefficients $c(m)$ are calculated as a function of the specific linearity errors $a(m)$ and said net linearity error E.

74. The method of claim 73, wherein said generating the net linearity error E comprises:
    applying a frequency domain transform to the recorded plurality of output digital signals to generate a frequency domain representation thereof;
    extracting a net linearity error spectrum from the frequency domain representation of the recorded plurality of output digital signals;
    applying an inverse frequency domain transform algorithm to the net linearity error spectrum to generate the net linearity error E.

75. The method of claim 74, wherein the extracting the net linearity error spectrum comprises performing two or more of the following:
    removing spectral content at zero frequency from the frequency domain representations of the recorded plurality of output digital signals;
    removing spectral content at a frequency of the analog waveform from the frequency domain representations of the recorded plurality of output digital signals;
    removing spectral content from a range of frequencies containing quantization noise from the frequency domain representations of the recorded plurality of output digital signals.

76. The method of claim 73, wherein calculating the correction coefficients c(m) comprises iteratively minimizing a power content between said net linearity error E and said specific linearity errors a(m) to produce said coefficients c(m).

77. The method of claim 64, further comprising:
applying an analog waveform to the A/D converter prior to said recording, wherein the A/D converter generates the output digital signals in response to the analog waveform.

78. A system for generating a linearity error correction device for use in an A/D converter, the system comprising:
a first memory connected to the A/D converter for storing a plurality of output digital signals generated by the A/D converter; and
a computer system, coupled to the first memory and to the linearity error correction device, for calculating a plurality of first digital signals from the plurality of output digital signals, wherein the computer is operable to generate linearity error information from the plurality of the output digital signals, calculate linearity error correction coefficients c(m) as a function of the linearity error information, and generate the plurality of first digital signals from the linearity error correction coefficients c(m);
wherein the plurality of first digital signals are useable in configuring the linearity error correction device.

79. The system of claim 78, wherein the A/D converter includes an internal D/A converter, wherein said internal D/A converter includes a plurality n of current generators, wherein one or more of said current generators produces linearity errors in the A/D converter, wherein each of said linearity error correction coefficients c(m) corresponds to a particular active state of a generator comprised in the internal D/A converter in the A/D converter.

80. The system of claim 79, wherein the plurality of first digital signals are generated as a function of said error correction coefficients c(m) for each value of m from 1 to n,
wherein, in generating said linearity error information, the computer is operable to sort the plurality of output digital signals into sub-sets of output digital signals, each sub-set corresponding to a particular active state of a generator comprised in the internal D/A converter in the A/D converter, wherein the computer generates specific linearity errors a(m) from the sub-sets of output digital signals;
wherein said linearity error correction coefficients c(m) are calculated as a function of the specific linearity errors a(m).

81. The system of claim 79, wherein the plurality of first digital signals are generated as a function of said error correction coefficients c(m) for each value of m from 1 to n,
wherein, in generating said linearity error information, the computer is operable to sort the plurality of output digital signals into sub-sets of output digital signals, each sub-set corresponding to a particular active state of a generator comprised in the internal D/A converter in the A/D converter, wherein the computer generates specific linearity error spectrums from the sub-sets of output digital signals;
wherein said linearity error correction coefficients c(m) are calculated as a function of the specific linearity error spectrums.

82. The system of claim 78, further comprising:
an analog waveform generator selectively connected to the A/D converter for providing an analog waveform to the A/D converter, wherein the A/D converter generates the output digital signals in response to the analog waveform generated by the analog waveform generator when the analog waveform generator is connected to the A/D converter.

83. A memory media which stores program instructions for constructing a linearity error correction device for use in an A/D converter, wherein the program instructions implement:
receiving a recorded plurality of output digital signals generated by the A/D converter;
generating linearity error information from the recorded plurality of output digital signals;
calculating linearity error correction coefficients c(m) in response to the linearity error information; and
constructing the linearity error correction device using said linearity error correction coefficients c(m).

84. The memory media of claim 83, wherein said constructing the linearity error correction device comprises:
generating a plurality of first digital values from the linearity error correction coefficients c(m);
constructing said linearity error correction device using said plurality of first digital values.

85. The memory media of claim 84, wherein said constructing said linearity error correction device comprises configuring a look-up table including said plurality of first digital values;
wherein said plurality of first digital values are addressable by an output of the A/D converter.

86. The memory media of claim 83, wherein the A/D converter includes an internal D/A converter, wherein said internal D/A converter includes a plurality of current generators, wherein one or more of said current generators produces linearity errors in the A/D converter, wherein each of said linearity error correction coefficients c(m) corresponds to a particular active state of a generator comprised in the internal D/A converter in the A/D converter.

87. The memory media of claim 86, wherein said constructing the linearity error correction device comprises:
generating a plurality of first digital values from the linearity error correction coefficients c(m);
constructing said linearity error correction device using said plurality of first digital values.

88. The memory media of claim 87, wherein the plurality of first digital values are generated as a function of said error correction coefficients c(m) for each value of m from 1 to n, wherein n represents a number of current generators contained within the internal D/A converter of the A/D converter;
wherein said generating linearity error information includes:
sorting the recorded plurality of output digital signals into subsets of output digital signals, each sub-set corresponding to a particular active state of a generator comprised in the internal D/A converter in the A/D converter;
generating specific linearity errors a(m) from the sub-sets of output digital signals;
wherein said linearity error correction coefficients c(m) are calculated as a function of the specific linearity errors a(m).

89. The memory media of claim 88, wherein said generating linearity error information farther comprises:

generating a net linearity error E from the recorded plurality of output digital signals;

wherein said linearity error correction coefficients c(m) are calculated as a function of the specific linearity errors a(m) and said net linearity error E.

90. The memory media of claim 83, wherein the recorded plurality of output digital signals are generated in response to an analog waveform applied to the A/D converter.

* * * * *